US009202456B2

(12) United States Patent
Lee et al.

(10) Patent No.: US 9,202,456 B2
(45) Date of Patent: Dec. 1, 2015

(54) SYSTEMS, METHODS, APPARATUS, AND COMPUTER-READABLE MEDIA FOR AUTOMATIC CONTROL OF ACTIVE NOISE CANCELLATION

(75) Inventors: Te-Won Lee, San Diego, CA (US); Hyun Jin Park, San Diego, CA (US); Jeremy Toman, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 661 days.

(21) Appl. No.: 12/765,554

(22) Filed: Apr. 22, 2010

(65) Prior Publication Data

US 2010/0296668 A1 Nov. 25, 2010

Related U.S. Application Data

(60) Provisional application No. 61/172,047, filed on Apr. 23, 2009, provisional application No. 61/265,943, filed on Dec. 2, 2009, provisional application No. 61/296,729, filed on Jan. 20, 2010.

(51) Int. Cl.

| | |
|---|---|
| ***H04B 15/00*** | (2006.01) |
| ***G10K 11/16*** | (2006.01) |
| ***H03B 29/00*** | (2006.01) |
| ***G10K 11/178*** | (2006.01) |
| *H04R 3/00* | (2006.01) |

(52) U.S. Cl.

CPC .... *G10K 11/1784* (2013.01); *G10K 2210/1053* (2013.01); *G10K 2210/1081* (2013.01); *G10K 2210/3014* (2013.01); *G10K 2210/51* (2013.01); *H04R 3/005* (2013.01); *H04R 2410/05* (2013.01)

(58) Field of Classification Search

CPC ............... H04R 3/005; H04R 2410/05; H04R 2410/07; G10L 21/0208-21/0264

USPC ..................... 381/71.1-71.14, 94.1-94.9, 74, 381/98-109, 86, 56-59; 704/225-226

See application file for complete search history.

(56) References Cited

U.S. PATENT DOCUMENTS

| | | | | |
|---|---|---|---|---|
| 4,641,344 | A * | 2/1987 | Kasai et al. | 381/57 |
| 5,105,377 | A | 4/1992 | Ziegler | |
| 5,388,185 | A | 2/1995 | Terry | |
| 5,485,515 | A | 1/1996 | Allen et al. | |
| 5,524,148 | A | 6/1996 | Allen et al. | |
| 5,526,419 | A | 6/1996 | Allen et al. | |
| 5,553,134 | A | 9/1996 | Allen et al. | |
| 5,646,961 | A | 7/1997 | Shoham et al. | |

(Continued)

FOREIGN PATENT DOCUMENTS

| | | | |
|---|---|---|---|
| CN | 85105410 | A | 1/1987 |
| CN | 1613109 | A | 5/2005 |

(Continued)

OTHER PUBLICATIONS

Jiang, F. et al. New Robust Adaptive Algorithm for Multichannel Adaptive Active Noise Control. Proc. 1997 IEEE Int'l Conf. Control Appl., Oct. 5-7, 1997, pp. 528-533.

(Continued)

*Primary Examiner* — Xu Mei
(74) *Attorney, Agent, or Firm* — Espartaco Diaz Hidalgo

(57) ABSTRACT

Active noise cancellation is combined with spectrum modification of a reproduced audio signal to enhance intelligibility.

20 Claims, 28 Drawing Sheets

(56) References Cited

U.S. PATENT DOCUMENTS

| | | | | |
|---|---|---|---|---|
| 5,699,382 | A | 12/1997 | Shoham et al. | |
| 5,764,698 | A | 6/1998 | Sudharsanan et al. | |
| 5,794,187 | A | 8/1998 | Franklin et al. | |
| 5,937,070 | A | 8/1999 | Todter et al. | |
| 6,002,776 | A | 12/1999 | Bhadkamkar et al. | |
| 6,064,962 | A | 5/2000 | Oshikiri et al. | |
| 6,240,192 | B1 | 5/2001 | Brennan | |
| 6,411,927 | B1 | 6/2002 | Morin et al. | |
| 6,415,253 | B1 | 7/2002 | Johnson | |
| 6,616,481 | B2 | 9/2003 | Ichio | |
| 6,618,481 | B1 | 9/2003 | Schmidt | |
| 6,678,651 | B2 | 1/2004 | Gao | |
| 6,704,428 | B1 | 3/2004 | Wurtz | |
| 6,732,073 | B1 | 5/2004 | Kluender et al. | |
| 6,757,395 | B1 | 6/2004 | Fang et al. | |
| 6,834,108 | B1 | 12/2004 | Schmidt | |
| 6,885,752 | B1 | 4/2005 | Chabries | |
| 6,937,738 | B2 | 8/2005 | Armstrong | |
| 6,968,171 | B2 | 11/2005 | Vanderhelm | |
| 6,970,558 | B1 | 11/2005 | Schmidt | |
| 6,980,665 | B2 | 12/2005 | Kates | |
| 6,993,480 | B1 | 1/2006 | Klayman | |
| 7,010,133 | B2 | 3/2006 | Chalupper et al. | |
| 7,010,480 | B2 | 3/2006 | Gao et al. | |
| 7,020,288 | B1 * | 3/2006 | Ohashi | 381/71.4 |
| 7,031,460 | B1 | 4/2006 | Zheng | |
| 7,050,966 | B2 | 5/2006 | Schneider | |
| 7,099,821 | B2 | 8/2006 | Visser et al. | |
| 7,103,188 | B1 | 9/2006 | Jones | |
| 7,120,579 | B1 | 10/2006 | Licht et al. | |
| 7,181,034 | B2 | 2/2007 | Armstrong | |
| 7,242,763 | B2 | 7/2007 | Etter | |
| 7,277,554 | B2 | 10/2007 | Kates | |
| 7,336,662 | B2 | 2/2008 | Hassan-Ali et al. | |
| 7,382,886 | B2 | 6/2008 | Henn et al. | |
| 7,433,481 | B2 | 10/2008 | Armstrong | |
| 7,444,280 | B2 | 10/2008 | Vandali et al. | |
| 7,492,889 | B2 | 2/2009 | Ebenezer | |
| 7,516,065 | B2 | 4/2009 | Marumoto | |
| 7,564,978 | B2 | 7/2009 | Engdegard et al. | |
| 7,676,374 | B2 | 3/2010 | Tammi | |
| 7,711,552 | B2 | 5/2010 | Villemoes | |
| 7,729,775 | B1 | 6/2010 | Saoji et al. | |
| 8,095,360 | B2 | 1/2012 | Gao | |
| 8,102,872 | B2 | 1/2012 | Spindola et al. | |
| 8,103,008 | B2 | 1/2012 | Johnston | |
| 8,160,273 | B2 | 4/2012 | Visser et al. | |
| 8,194,872 | B2 * | 6/2012 | Buck et al. | 381/71.11 |
| 8,265,297 | B2 | 9/2012 | Shiraishi | |
| 2001/0001853 | A1 | 5/2001 | Mauro et al. | |
| 2002/0076072 | A1 | 6/2002 | Cornelisse | |
| 2002/0193130 | A1 | 12/2002 | Yang et al. | |
| 2003/0023433 | A1 | 1/2003 | Erell et al. | |
| 2003/0093268 | A1 | 5/2003 | Zinser, Jr. et al. | |
| 2003/0158726 | A1 | 8/2003 | Philippe et al. | |
| 2003/0198357 | A1 | 10/2003 | Schneider et al. | |
| 2004/0059571 | A1 | 3/2004 | Ohtomo | |
| 2004/0125973 | A1 | 7/2004 | Fang | |
| 2004/0136545 | A1 | 7/2004 | Sarpeshkar et al. | |
| 2004/0161121 | A1 | 8/2004 | Chol et al. | |
| 2004/0196994 | A1 | 10/2004 | Kates | |
| 2004/0252846 | A1 * | 12/2004 | Nonaka et al. | 381/71.4 |
| 2004/0252850 | A1 | 12/2004 | Turicchia et al. | |
| 2005/0141737 | A1 | 6/2005 | Hansen | |
| 2005/0152563 | A1 | 7/2005 | Amada et al. | |
| 2005/0165603 | A1 | 7/2005 | Bessette et al. | |
| 2005/0165608 | A1 | 7/2005 | Suzuki et al. | |
| 2005/0207585 | A1 | 9/2005 | Christoph | |
| 2006/0008101 | A1 | 1/2006 | Kates | |
| 2006/0069556 | A1 | 3/2006 | Nadjar | |
| 2006/0149532 | A1 | 7/2006 | Boillot et al. | |
| 2006/0217977 | A1 | 9/2006 | Gaeta et al. | |
| 2006/0222184 | A1 | 10/2006 | Buck et al. | |
| 2006/0262938 | A1 | 11/2006 | Gauger | |
| 2006/0262939 | A1 | 11/2006 | Buchner et al. | |
| 2006/0270467 | A1 | 11/2006 | Song et al. | |
| 2006/0293882 | A1 | 12/2006 | Giesbrecht et al. | |
| 2007/0053528 | A1 | 3/2007 | Kim | |
| 2007/0092089 | A1 | 4/2007 | Seefeldt et al. | |
| 2007/0100605 | A1 | 5/2007 | Renevey et al. | |
| 2007/0110042 | A1 | 5/2007 | Li et al. | |
| 2007/0230556 | A1 | 10/2007 | Nakano | |
| 2008/0039162 | A1 | 2/2008 | Anderton | |
| 2008/0112569 | A1 | 5/2008 | Asada | |
| 2008/0130929 | A1 | 6/2008 | Arndt | |
| 2008/0152167 | A1 | 6/2008 | Taenzer | |
| 2008/0175422 | A1 | 7/2008 | Kates | |
| 2008/0186218 | A1 | 8/2008 | Ohkuri et al. | |
| 2008/0215332 | A1 | 9/2008 | Zeng et al. | |
| 2008/0243496 | A1 | 10/2008 | Wang | |
| 2008/0269926 | A1 | 10/2008 | Xiang | |
| 2009/0024185 | A1 | 1/2009 | Kulkarni et al. | |
| 2009/0034748 | A1 | 2/2009 | Sibbald | |
| 2009/0111507 | A1 | 4/2009 | Chen | |
| 2009/0170550 | A1 | 7/2009 | Foley | |
| 2009/0192803 | A1 | 7/2009 | Nagaraja et al. | |
| 2009/0254340 | A1 | 10/2009 | Sun et al. | |
| 2009/0271187 | A1 | 10/2009 | Yen et al. | |
| 2009/0299742 | A1 | 12/2009 | Toman et al. | |
| 2009/0310793 | A1 | 12/2009 | Ohkuri et al. | |
| 2009/0323982 | A1 * | 12/2009 | Solbach et al. | 381/94.3 |
| 2010/0017205 | A1 | 1/2010 | Visser et al. | |
| 2010/0131269 | A1 | 5/2010 | Park et al. | |
| 2010/0150367 | A1 | 6/2010 | Mizuno | |
| 2010/0296666 | A1 | 11/2010 | Lin | |
| 2011/0007907 | A1 | 1/2011 | Park et al. | |
| 2011/0099010 | A1 | 4/2011 | Zhang | |
| 2011/0137646 | A1 | 6/2011 | Ahgren et al. | |
| 2011/0142256 | A1 * | 6/2011 | Lee et al. | 381/94.3 |
| 2011/0293103 | A1 | 12/2011 | Park et al. | |
| 2012/0148057 | A1 | 6/2012 | Beerends et al. | |
| 2012/0263317 | A1 | 10/2012 | Shin et al. | |

FOREIGN PATENT DOCUMENTS

| | | | |
|---|---|---|---|
| CN | 1684143 | A | 10/2005 |
| CN | 101105941 | A | 1/2008 |
| EP | 0742548 | A2 | 11/1996 |
| EP | 0643881 | B1 | 12/1998 |
| EP | 1081685 | A2 | 3/2001 |
| EP | 1232494 | A1 | 8/2002 |
| EP | 1522206 | A1 | 4/2005 |
| JP | 03266899 | | 11/1991 |
| JP | 6175691 | A | 6/1994 |
| JP | H06343196 | A | 12/1994 |
| JP | 9006391 | A | 1/1997 |
| JP | 10268873 | A | 10/1998 |
| JP | H10294989 | A | 11/1998 |
| JP | 11298990 | A | 10/1999 |
| JP | 2000082999 | A | 3/2000 |
| JP | 2001292491 | A | 10/2001 |
| JP | 2002369281 | | 12/2002 |
| JP | 2003218745 | A | 7/2003 |
| JP | 2003271191 | A | 9/2003 |
| JP | 2004120717 | A | 4/2004 |
| JP | 2004289614 | A | 10/2004 |
| JP | 2005168736 | | 6/2005 |
| JP | 2005195955 | A | 7/2005 |
| JP | 2006276856 | A | 10/2006 |
| JP | 2006340391 | A | 12/2006 |
| JP | 2007295528 | A | 11/2007 |
| JP | 2008507926 | A | 3/2008 |
| JP | 2008122729 | A | 5/2008 |
| JP | 2008193421 | A | 8/2008 |
| JP | 2009031793 | A | 2/2009 |
| JP | 2009302991 | A | 12/2009 |
| JP | 2010021627 | A | 1/2010 |
| KR | 19970707648 | | 12/1997 |
| TW | 1238012 | B | 8/2005 |
| TW | 200623023 | | 7/2006 |
| TW | 1279775 | B | 4/2007 |
| TW | I289025 | B | 10/2007 |
| WO | 9326085 | A1 | 12/1993 |
| WO | WO9711533 | A1 | 3/1997 |

(56) References Cited

FOREIGN PATENT DOCUMENTS

| | | | |
|---|---|---|---|
| WO | WO2005069275 | A1 | 7/2005 |
| WO | WO2006012578 | | 2/2006 |
| WO | 2006028587 | | 3/2006 |
| WO | 2007046435 | A1 | 4/2007 |
| WO | 2008138349 | A2 | 11/2008 |
| WO | WO2009092522 | A1 | 7/2009 |
| WO | 2010009414 | A1 | 1/2010 |

OTHER PUBLICATIONS

Payan, R. Parametric Equalization on TMS320C6000 DSP. Application Report SPRA867, Dec. 2002, Texas Instruments, Dallas, TX. 29 pp.
Streeter, A. et al. Hybrid Feedforward-Feedback Actice Noise Control. Proc. 2004 Amer. Control Conf., Jun. 30-Jul. 2, 2004, Amer. Auto Control Council, pp. 2876-2881, Boston, MA.
Valin, J.-M. et al. Microphone array post-filter for separation of simultaneous non-stationary sources. Proc. IEEE Int'l Conf. Acoustics, Speech, and Speech Proc'g. ICASSP '04, May 17-24, 2004, Montreal, CA, vol. 1, pp. 221-224.
De Diego, M. et al. An adaptive algorithms comparison for real multichannel active noise control. EUSIPCO (European Signal Processing Conference) 2004, Sep. 6-10, 2004, Vienna, AT, vol. II, pp. 925-928.
Araki, S. et al. Subband based blind source separation for convolutive mixtures of speech. Proc. IEEE Int'l Conf. Acoustics, Speech, and Speech Proc'g. ICASSP '03, Apr. 6-10, 2003, Hong Kong, CN, vol. 5, pp. V_509-V_512.
Aichner, R. et al. Post-Processing for Convolutive Blind Source Separation. Proc. IEEE Int'l Conf. Acoustics, Speech, and Speech Proc'g. ICASSP '06, May 14-19, 2006, Toulouse, FR, vol. 5, pp. 37-40.
Brian C. J. Moore, et al., "A Model for the Prediction of Thresholds, Loudness, and Partial Loudness", J. Audio Eng. Soc., pp. 224-240, vol. 45, No. 4, Apr. 1997.
Esben Skovenborg, et al., "Evaluation of Different Loudness Models with Music and Speech Material", Oct. 28-31, 2004.
Hasegawa et al, "Environmental Acoustic Noise Cancelling based on for rant Enhancement," Studia'Phonologic, 1984, 59-68.
Hermansen K. , "ASPI-project proposal(9-10 sem.)," Speech Enhancement. Aalborg University, 2009, 4.
International Search Report and Written Opinion—PCT/US2010/032190, International Search Authority—European Patent Office—Oct. 12, 2010.
J.B. Laflen et al. A Flexible Analytical Framework for Applying and Testing Alternative Spectral Enhancement Algorithms (poster). International Hearing Aid Convention (IHCON) 2002. (original document is a poster, submitted here as 3 pp.) Last accessed Mar. 16, 2009 at.
Laflen J.B., et al., "A Flexible, Analytical Framework for Applying and Testing Alternative Spectral Enhancement Algorithms," International Hearing Aid Convention , 2002, 200-211.
Shin. "Perceptual Reinforcement of Speech Signal Based on Partial Specific Loudness," IEEE Signal Processing Letters. Nov. 2007, pp. 887-890, vol. 14. No. 11.
T. Baer, et al., Spectral contrast enhancement of speech in noise for listeners with sensonneural hearing impairment: effects on intelligibility, quality, and response times. J. Rehab, Research and Dev., vol. 20, No. 1, 1993. pp. 49-72.
Turicchia L., et al., "A Bio-Inspired Companding Strategy for, Spectral Enhancement," IEEE Transactions on Speech and Audio Processing, 2005, vol. 13 (2), 243-253.
Visser, et al.: "Blind source separation in mobile environments using a priori knowledge" Acoustics, speech, and signal processing, 2004 Proceedings ICASSP 2004, IEEE Int'l Conference, Montreal, Quebec, Canada, May 17-21, 2004, Piscataway, NJ, US, IEEE vol. 3 May 17, 2004, pp. 893-896, ISSBN: 978-0-7803-8484-2.
Yang J., et al., "Spectral contrast enhancement," Algorithms and comparisons. Speech Communication 2003, vol. 39, 33-46.
Taiwan Search Report—TW099113053—TIPO—Jan. 31, 2013.
Orourke, "Real world evaluation of mobile phone speech enhancement algorithms," 2002.
Tzur et al., "Sound Equalization in a noisy environment," 2001.

* cited by examiner ear hook Z30
housing Z10
earphone Z20
device D100
A
A device D100
ear hook Z30
secondary microphone port Z50
housing Z10
A
A primary microphone port Z40
ear hook Z30
earphone Z20
device D100
A
A device D100
primary microphone port Z40
housing Z10
ear hook Z30
earphone Z20

SYSTEMS, METHODS, APPARATUS, AND COMPUTER-READABLE MEDIA FOR AUTOMATIC CONTROL OF ACTIVE NOISE CANCELLATION

CLAIM OF PRIORITY UNDER 35 U.S.C. §119

The present Application for Patent claims priority to U.S. Provisional Pat. Appl. No. 61/172,047, entitled "Method to Control ANC Enablement," filed Apr. 23, 2009 and assigned to the assignee hereof. The present Application for Patent also claims priority to U.S. Provisional Pat. Appl. No. 61/265,943, entitled "Systems, methods, apparatus, and computer-readable media for automatic control of active noise cancellation," filed Dec. 2, 2009 and assigned to the assignee hereof. The present Application for Patent also claims priority to U.S. Provisional Pat. Appl. No. 61/296,729, entitled "Systems, methods, apparatus, and computer-readable media for automatic control of active noise cancellation," filed Jan. 20, 2010 and assigned to the assignee hereof.

BACKGROUND

1. Field

This disclosure relates to processing of audio-frequency signals.

2. Background

Active noise cancellation (ANC, also called active noise reduction) is a technology that actively reduces ambient acoustic noise by generating a waveform that is an inverse form of the noise wave (e.g., having the same level and an inverted phase), also called an "antiphase" or "anti-noise" waveform. An ANC system generally uses one or more microphones to pick up an external noise reference signal, generates an anti-noise waveform from the noise reference signal, and reproduces the anti-noise waveform through one or more loudspeakers. This anti-noise waveform interferes destructively with the original noise wave to reduce the level of the noise that reaches the ear of the user.

An ANC system may include a shell that surrounds the user's ear or an earbud that is inserted into the user's ear canal. Devices that perform ANC typically enclose the user's ear (e.g., a closed-ear headphone) or include an earbud that fits within the user's ear canal (e.g., a wireless headset, such as a Bluetooth™ headset). In headphones for communications applications, the equipment may include a microphone and a loudspeaker, where the microphone is used to capture the user's voice for transmission and the loudspeaker is used to reproduce the received signal. In such case, the microphone may be mounted on a boom and the loudspeaker may be mounted in an earcup or earplug.

Active noise cancellation techniques may be applied to sound reproduction devices, such as headphones, and personal communications devices, such as cellular telephones, to reduce acoustic noise from the surrounding environment. In such applications, the use of an ANC technique may reduce the level of background noise that reaches the ear (e.g., by up to twenty decibels) while delivering useful sound signals, such as music and far-end voices.

SUMMARY

A method of processing a reproduced audio signal according to a general configuration includes generating a noise estimate based on information from a first channel of a sensed multichannel audio signal and information from a second channel of the sensed multichannel audio signal. This method also includes boosting at least one frequency subband of the reproduced audio signal with respect to at least one other frequency subband of the reproduced audio signal, based on information from the noise estimate, to produce an equalized audio signal. This method also includes generating an anti-noise signal based on information from a sensed noise reference signal, and combining the equalized audio signal and the anti-noise signal to produce an audio output signal. Such a method may be performed within a device that is configured to process audio signals.

A computer-readable medium according to a general configuration has tangible features that store machine-executable instructions which when executed by at least one processor cause the at least one processor to perform such a method.

An apparatus configured to process a reproduced audio signal according to a general configuration includes means for generating a noise estimate based on information from a first channel of a sensed multichannel audio signal and information from a second channel of the sensed multichannel audio signal. This apparatus also includes means for boosting at least one frequency subband of the reproduced audio signal with respect to at least one other frequency subband of the reproduced audio signal, based on information from the noise estimate, to produce an equalized audio signal. This apparatus also includes means for generating an anti-noise signal based on information from a sensed noise reference signal, and means for combining the equalized audio signal and the anti-noise signal to produce an audio output signal.

An apparatus configured to process a reproduced audio signal according to a general configuration includes a spatially selective filter configured to generate a noise estimate based on information from a first channel of a sensed multichannel audio signal and information from a second channel of the sensed multichannel audio signal. This apparatus also includes an equalizer configured to boost at least one frequency subband of the reproduced audio signal with respect to at least one other frequency subband of the reproduced audio signal, based on information from the noise estimate, to produce an equalized audio signal. This apparatus also includes an active noise cancellation filter configured to generate an anti-noise signal based on information from a sensed noise reference signal, and an audio output stage configured to combine the equalized audio signal and the anti-noise signal to produce an audio output signal.

DETAILED DESCRIPTION

Figure 1A:
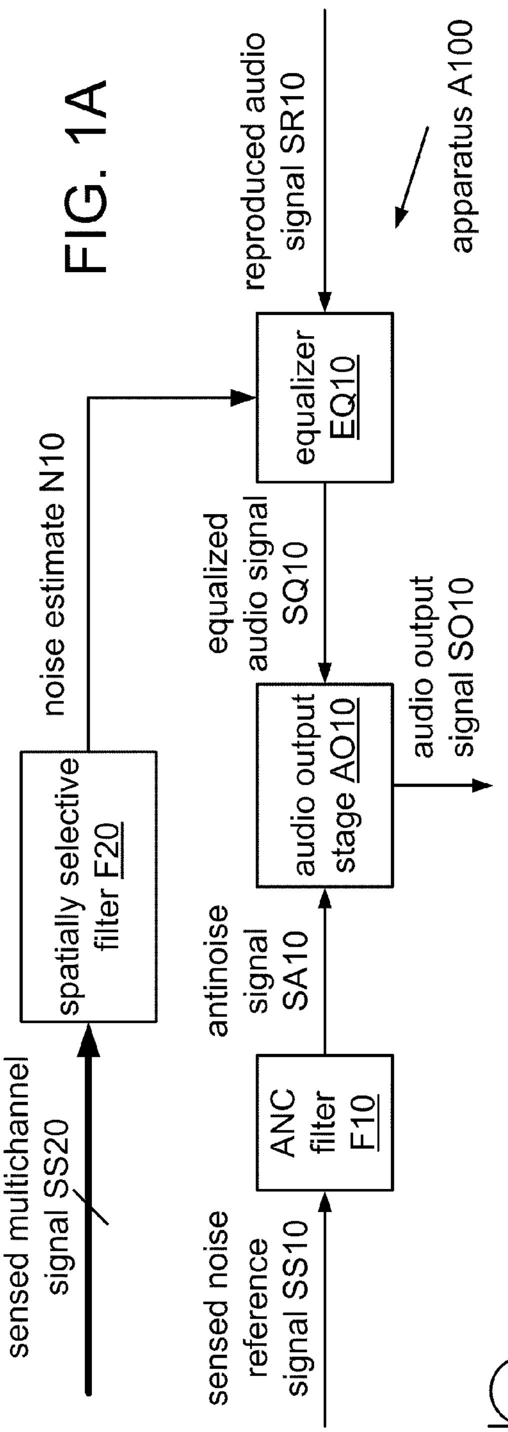
FIG. 1A shows a block diagram of an apparatus A100 according to a general configuration.

Unless expressly limited by its context, the term "signal" is used herein to indicate any of its ordinary meanings, including a state of a memory location (or set of memory locations) as expressed on a wire, bus, or other transmission medium. Unless expressly limited by its context, the term "generating" is used herein to indicate any of its ordinary meanings, such as computing or otherwise producing. Unless expressly limited by its context, the term "calculating" is used herein to indicate any of its ordinary meanings, such as computing, evaluating, estimating, and/or selecting from a plurality of values. Unless expressly limited by its context, the term "obtaining" is used to indicate any of its ordinary meanings, such as calculating, deriving, receiving (e.g., from an external device), and/or retrieving (e.g., from an array of storage elements). Unless expressly limited by its context, the term "selecting" is used to indicate any of its ordinary meanings, such as identifying, indicating, applying, and/or using at least one, and fewer than all, of a set of two or more. Where the term "comprising" is used in the present description and claims, it does not exclude other elements or operations. The term "based on" (as in "A is based on B") is used to indicate any of its ordinary meanings, including the cases (i) "derived from" (e.g., "B is a precursor of A"), (ii) "based on at least" (e.g., "A is based on at least B") and, if appropriate in the particular context, (iii) "equal to" (e.g., "A is equal to B" or "A is the same as B"). Similarly, the term "in response to" is used to indicate any of its ordinary meanings, including "in response to at least."

References to a "location" of a microphone of a multi-microphone audio sensing device indicate the location of the center of an acoustically sensitive face of the microphone, unless otherwise indicated by the context. The term "channel" is used at times to indicate a signal path and at other times to indicate a signal carried by such a path, according to the particular context. Unless otherwise indicated, the term "series" is used to indicate a sequence of two or more items. The term "logarithm" is used to indicate the base-ten logarithm, although extensions of such an operation to other bases are within the scope of this disclosure. The term "frequency component" is used to indicate one among a set of frequencies or frequency bands of a signal, such as a sample (or "bin") of a frequency domain representation of the signal (e.g., as produced by a fast Fourier transform) or a subband of the signal (e.g., a Bark scale or mel scale subband).

Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The term "configuration" may be used in reference to a method, apparatus, and/or system as indicated by its particular context. The terms "method," "process," "procedure," and "technique" are used generically and interchangeably unless otherwise indicated by the particular context. The terms "apparatus" and "device" are also used generically and interchangeably unless otherwise indicated by the particular context. The terms "element" and "module" are typically used to indicate a portion of a greater configuration. Unless expressly limited by its context, the term "system" is used herein to indicate any of its ordinary meanings, including "a group of elements that interact to serve a common purpose." Any incorporation by reference of a portion of a document shall also be understood to incorporate definitions of terms or variables that are referenced within the portion, where such definitions appear elsewhere in the document, as well as any figures referenced in the incorporated portion.

The near-field may be defined as that region of space which is less than one wavelength away from a sound receiver (e.g., a microphone array). Under this definition, the distance to the boundary of the region varies inversely with frequency. At frequencies of two hundred, seven hundred, and two thousand hertz, for example, the distance to a one-wavelength boundary is about 170, forty-nine, and seventeen centimeters, respectively. It may be useful instead to consider the near-field/far-field boundary to be at a particular distance from the microphone array (e.g., fifty centimeters from a microphone of the array or from the centroid of the array, or one meter or 1.5 meters from a microphone of the array or from the centroid of the array).

The terms "coder," "codec," and "coding system" are used interchangeably to denote a system that includes at least one encoder configured to receive and encode frames of an audio signal (possibly after one or more pre-processing operations, such as a perceptual weighting and/or other filtering operation) and a corresponding decoder configured to produce decoded representations of the frames. Such an encoder and decoder are typically deployed at opposite terminals of a communications link. In order to support a full-duplex communication, instances of both of the encoder and the decoder are typically deployed at each end of such a link.

In this description, the term "sensed audio signal" denotes a signal that is received via one or more microphones, and the term "reproduced audio signal" denotes a signal that is reproduced from information that is retrieved from storage and/or received via a wired or wireless connection to another device. An audio reproduction device, such as a communications or playback device, may be configured to output the reproduced audio signal to one or more loudspeakers of the device. Alternatively, such a device may be configured to output the reproduced audio signal to an earpiece, other headset, or external loudspeaker that is coupled to the device via a wire or wirelessly. With reference to transceiver applications for voice communications, such as telephony, the sensed audio signal is the near-end signal to be transmitted by the transceiver, and the reproduced audio signal is the far-end signal received by the transceiver (e.g., via a wireless communications link). With reference to mobile audio reproduction applications, such as playback of recorded music, video, or speech (e.g., MP3-encoded music files, movies, video clips, audiobooks, podcasts) or streaming of such content, the reproduced audio signal is the audio signal being played back or streamed.

It may be desirable to use ANC in conjunction with reproduction of a desired audio signal. For example, an earphone or headphones used for listening to music, or a wireless headset used to reproduce the voice of a far-end speaker during a telephone call (e.g., a Bluetooth™ or other communications headset), may also be configured to perform ANC. Such a device may be configured to mix the reproduced audio signal (e.g., a music signal or a received telephone call) with an anti-noise signal upstream of a loudspeaker that is arranged to direct the resulting audio signal toward the user's ear.

Ambient noise may affect intelligibility of a reproduced audio signal in spite of the ANC operation. In one such example, an ANC operation may be less effective at higher frequencies than at lower frequencies, such that ambient noise at the higher frequencies may still affect intelligibility of the reproduced audio signal. In another such example, the gain of an ANC operation may be limited (e.g., to ensure stability). In a further such example, it may be desired to use a device that performs audio reproduction and ANC (e.g., a wireless headset, such as a Bluetooth™ headset) at only one of the user's ears, such that ambient noise heard by the user's other ear may affect intelligibility of the reproduced audio signal. In these and other cases, it may be desirable, in addition to performing an ANC operation, to modify the spectrum of the reproduced audio signal to boost intelligibility.

FIG. 1A shows a block diagram of an apparatus A100 according to a general configuration. Apparatus A100 includes an ANC filter F10 that is configured to produce an anti-noise signal SA10 (e.g., according to any desired digital and/or analog ANC technique) based on information from a sensed noise reference signal SS10 (e.g., an environmental sound signal or a feedback signal). Filter F10 may be arranged to receive sensed noise reference signal SS10 via one or more microphones. Such an ANC filter is typically configured to invert the phase of the sensed noise reference signal and may also be configured to equalize the frequency response and/or to match or minimize the delay. Examples of ANC operations that may be performed by ANC filter F10 on sensed noise reference signal SS10 to produce anti-noise signal SA10 include a phase-inverting filtering operation, a least mean squares (LMS) filtering operation, a variant or derivative of LMS (e.g., filtered-x LMS, as described in U.S. Pat. Appl. Publ. No. 2006/0069566 (Nadjar et al.) and elsewhere), and a digital virtual earth algorithm (e.g., as described in U.S. Pat. No. 5,105,377 (Ziegler)). ANC filter F10 may be configured to perform the ANC operation in the time domain and/or in a transform domain (e.g., a Fourier transform or other frequency domain).

ANC filter F10 is typically configured to invert the phase of sensed noise reference signal SS10 to produce anti-noise signal SA10. ANC filter F10 may also be configured to perform other processing operations on sensed noise reference signal SS10 (e.g., lowpass filtering) to produce anti-noise signal SA10. ANC filter F10 may also be configured to equalize the frequency response of the ANC operation and/or to match or minimize the delay of the ANC operation.

Apparatus A100 also includes a spatially selective filter F20 that is arranged to produce a noise estimate N10 based on information from a sensed multichannel signal SS20 that has at least a first channel and a second channel. Filter F20 may be configured to produce noise estimate N10 by attenuating components of the user's voice in sensed multichannel signal SS20. For example, filter F20 may be configured to perform a directionally selective operation that separates a directional source component (e.g., the user's voice) of sensed multichannel signal SS20 from one or more other components of the signal, such as a directional interfering component and/or a diffuse noise component. In such case, filter F20 may be configured to remove energy of the directional source component so that noise estimate N10 includes less of the energy of the directional source component than each channel of sensed multichannel audio signal SS20 does (that is to say, so that noise estimate N10 includes less of the energy of the directional source component than any individual channel of sensed multichannel signal SS20 does). For a case in which sensed multichannel signal SS20 has more than two channels, it may be desirable to configure filter F20 to perform spatially selective processing operations on different pairs of the channels and to combine the results of these operations to produce noise estimate N10.

Spatially selective filter F20 may be configured to process sensed multichannel signal SS20 as a series of segments. Typical segment lengths range from about five or ten milliseconds to about forty or fifty milliseconds, and the segments may be overlapping (e.g., with adjacent segments overlapping by 25% or 50%) or nonoverlapping. In one particular example, sensed multichannel signal SS20 is divided into a series of nonoverlapping segments or "frames", each having a length of ten milliseconds. Another element or operation of apparatus A100 (e.g., ANC filter F10 and/or equalizer EQ10) may also be configured to process its input signal as a series of segments, using the same segment length or using a different segment length. The energy of a segment may be calculated as the sum of the squares of the values of its samples in the time domain.

Spatially selective filter F20 may be implemented to include a fixed filter that is characterized by one or more matrices of filter coefficient values. These filter coefficient values may be obtained using a beamforming, blind source separation (BSS), or combined BSS/beamforming method. Spatially selective filter F20 may also be implemented to include more than one stage. Each of these stages may be based on a corresponding adaptive filter structure, whose coefficient values may be calculated using a learning rule derived from a source separation algorithm. The filter structure may include feedforward and/or feedback coefficients and may be a finite-impulse-response (FIR) or infinite-impulse-response (IIR) design. For example, filter F20 may be implemented to include a fixed filter stage (e.g., a trained filter stage whose coefficients are fixed before run-time) followed by an adaptive filter stage. In such case, it may be desirable to use the fixed filter stage to generate initial conditions for the adaptive filter stage. It may also be desirable to perform adaptive scaling of the inputs to filter F20 (e.g., to ensure stability of an IIR fixed or adaptive filter bank). It may be desirable to implement spatially selective filter F20 to include multiple fixed filter stages, arranged such that an appropriate one of the fixed filter stages may be selected during operation (e.g., according to the relative separation performance of the various fixed filter stages).

The term "beamforming" refers to a class of techniques that may be used for directional processing of a multichannel signal received from a microphone array (e.g., array R100 as described herein). Beamforming techniques use the time difference between channels that results from the spatial diversity of the microphones to enhance a component of the signal that arrives from a particular direction. More particularly, it is likely that one of the microphones will be oriented more directly at the desired source (e.g., the user's mouth), whereas the other microphone may generate a signal from this source that is relatively attenuated. These beamforming techniques are methods for spatial filtering that steer a beam towards a sound source, putting a null at the other directions. Beamforming techniques make no assumption on the sound source but assume that the geometry between source and sensors, or the sound signal itself, is known for the purpose of dereverberating the signal or localizing the sound source. The filter coefficient values of a beamforming filter may be calculated according to a data-dependent or data-independent beamformer design (e.g., a superdirective beamformer, least-squares beamformer, or statistically optimal beamformer design). Examples of beamforming approaches include generalized sidelobe cancellation (GSC), minimum variance distortionless response (MVDR), and/or linearly constrained minimum variance (LCMV) beamformers. It is noted that spatially selective filter F20 would typically be implemented as a null beamformer, such that energy from the directional source (e.g., the user's voice) would be attenuated to obtain noise estimate N10.

Blind source separation algorithms are methods of separating individual source signals (which may include signals from one or more information sources and one or more interference sources) based only on mixtures of the source signals. The range of BSS algorithms includes independent component analysis (ICA), which applies an "un-mixing" matrix of weights to the mixed signals (for example, by multiplying the matrix with the mixed signals) to produce separated signals; frequency-domain ICA or complex ICA, in which the filter coefficient values are computed directly in the frequency domain; independent vector analysis (IVA), a variation of complex ICA that uses a source prior which models expected dependencies among frequency bins; and variants such as constrained ICA and constrained IVA, which are constrained according to other a priori information, such as a known direction of each of one or more of the acoustic sources with respect to, for example, an axis of the microphone array.

Further examples of such adaptive filter structures, and learning rules based on ICA or IVA adaptive feedback and feedforward schemes that may be used to train such filter structures, may be found in US Publ. Pat. Appls. Nos. 2009/0022336, published Jan. 22, 2009, entitled "SYSTEMS, METHODS, AND APPARATUS FOR SIGNAL SEPARATION," and 2009/0164212, published Jun. 25, 2009, entitled "SYSTEMS, METHODS, AND APPARATUS FOR MULTI-MICROPHONE BASED SPEECH ENHANCEMENT."

It may be desirable to use one or more data-dependent or data-independent design techniques (MVDR, IVA, etc.) to generate a plurality of fixed null beams for spatially selective filter F20. For example, it may be desirable to store offline computed null beams in a lookup table, for selection among these null beams at run-time (e.g., as described in US Publ. Pat Appl. No. 2009/0164212). One such example includes sixty-five complex coefficients for each filter, and three filters to generate each beam.

Alternatively, spatially selective filter F20 may be configured to perform a directionally selective processing operation that is configured to compute, for at least one frequency component of sensed multichannel signal SS20, the phase difference between signals from two microphones. The relation between phase difference and frequency may be used to indicate the direction of arrival (DOA) of that frequency component. Such an implementation of filter F20 may be configured to classify individual frequency components as voice or noise according to the value of this relation (e.g., by comparing the value for each frequency component to a threshold value, which may be fixed or adapted over time and may be the same or different for different frequencies). In such case, filter F20 may be configured to produce noise estimate N10 as a sum of the frequency components that are classified as noise. Alternatively, filter F20 may be configured to indicate that a segment of sensed multichannel signal SS20 is voice when the relation between phase difference and frequency is consistent (i.e., when phase difference and frequency are correlated) over a wide frequency range, such as 500-2000 Hz, and is noise otherwise. In either case, it may be desirable to reduce fluctuation in noise estimate N10 by temporally smoothing its frequency components.

In one such example, filter S20 is configured to apply a directional masking function at each frequency component in the range under test to determine whether the phase difference at that frequency corresponds to a direction of arrival (or a time delay of arrival) that is within a particular range, and a coherency measure is calculated according to the results of such masking over the frequency range (e.g., as a sum of the mask scores for the various frequency components of the segment). Such an approach may include converting the phase difference at each frequency to a frequency-independent indicator of direction, such as direction of arrival or time difference of arrival (e.g., such that a single directional masking function may be used at all frequencies). Alternatively, such an approach may include applying a different respective masking function to the phase difference observed at each frequency. Filter F20 then uses the value of the coherency measure to classify the segment as voice or noise. In one such example, the directional masking function is selected to include the expected direction of arrival of the user's voice, such that a high value of the coherency measure indicates a voice segment. In another such example, the directional masking function is selected to exclude the expected direction of arrival of the user's voice (also called a "complementary mask"), such that a high value of the coherency measure indicates a noise segment. In either case, filter F20 may be configured to classify the segment by comparing the value of its coherency measure to a threshold value, which may be fixed or adapted over time.

Figure 16:
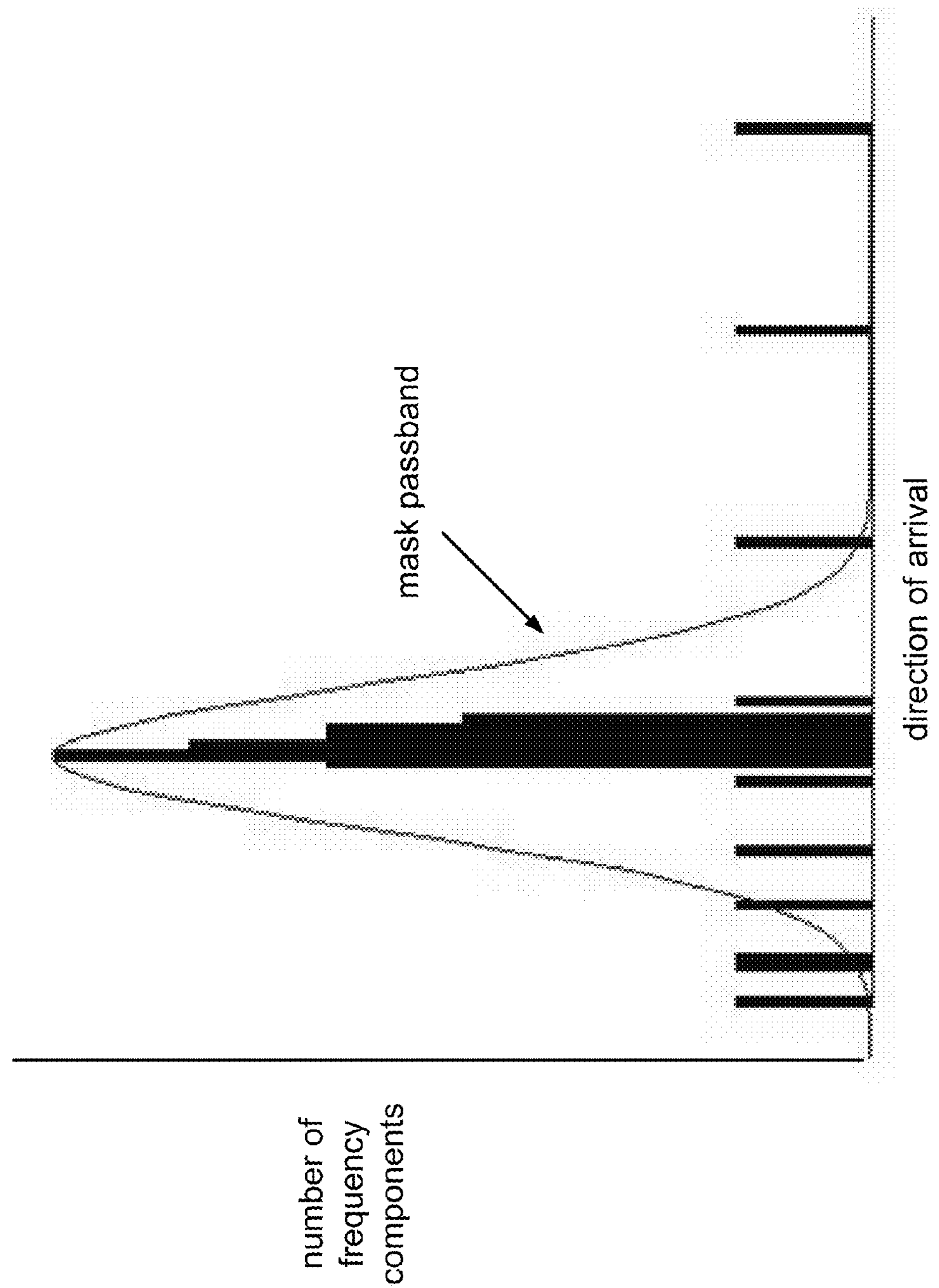
FIG. 16 shows an example histogram of the directions of arrival of the frequency components of a segment of sensed multichannel signal SS20.

In another such example, filter F20 is configured to calculate the coherency measure based on the shape of distribution of the directions (or time delays) of arrival of the individual frequency components in the frequency range under test (e.g., how tightly the individual DOAs are grouped together). Such a measure may be calculated using a histogram, as shown in the example of FIG. 16. In either case, it may be desirable to configure filter F20 to calculate the coherency measure based only on frequencies that are multiples of a current estimate of the pitch of the user's voice.

Alternatively or additionally, spatially selective filter F20 may be configured to produce noise estimate N10 by performing a gain-based proximity selective operation. Such an operation may be configured to indicate that a segment of sensed multichannel signal SS20 is voice when the ratio of the energies of two channels of sensed multichannel signal SS20 exceeds a proximity threshold value (indicating that the signal is arriving from a near-field source at a particular axis direction of the microphone array), and to indicate that the segment is noise otherwise. In such case, the proximity threshold value may be selected based on a desired near-field/far-field boundary radius with respect to the microphone pair. Such an implementation of filter F20 may be configured to operate on the signal in the frequency domain (e.g., over one or more particular frequency ranges) or in the time domain. In the frequency domain, the energy of a frequency component may be calculated as the squared magnitude of the corresponding frequency sample.

Apparatus A100 also includes an equalizer EQ10 that is configured to modify the spectrum of a reproduced audio signal SR10, based on information from noise estimate N10, to produce an equalized audio signal SQ10. Examples of reproduced audio signal SR10 include a far-end or downlink audio signal, such as a received telephone call, and a prerecorded audio signal, such as a signal being reproduced from a storage medium (e.g., a signal being decoded from an MP3, Advanced Audio Codec (AAC), Windows Media Audio/Video (WMA/WMV), or other audio or multimedia file). Equalizer EQ10 may be configured to equalize signal SR10 by boosting at least one subband of signal SR10 with respect to another subband of signal SR10, based on information from noise estimate N10. It may be desirable for equalizer EQ10 to remain inactive until reproduced audio signal SR10 is available (e.g., until the user initiates or receives a telephone call, or accesses media content or a voice recognition system providing signal SR10).

Figure 22:
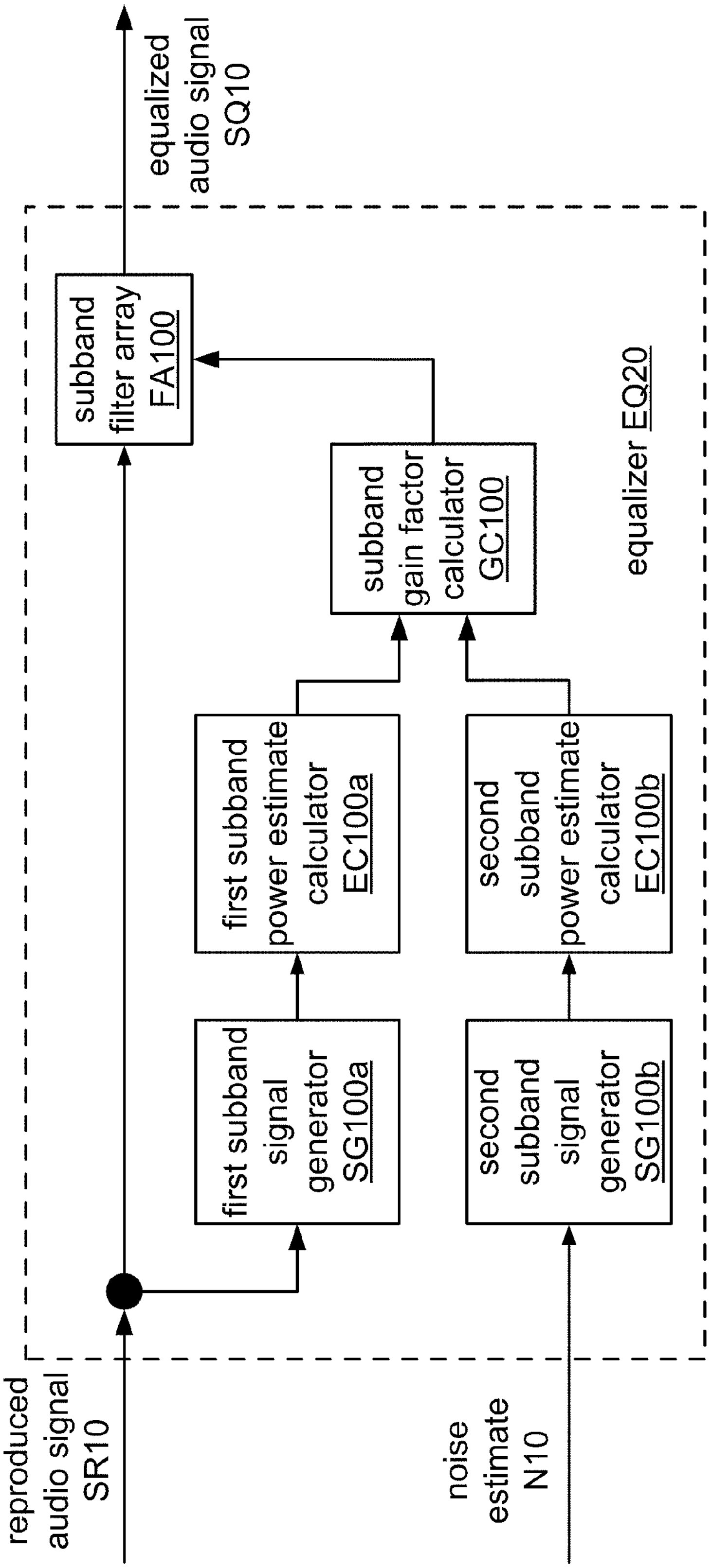
FIG. 22 shows a block diagram of an implementation EQ20 of equalizer EQ10.

FIG. 22 shows a block diagram of an implementation EQ20 of equalizer EQ10 that includes a first subband signal generator SG100*a* and a second subband signal generator SG100*b*. First subband signal generator SG100*a* is configured to produce a set of first subband signals based on information from reproduced audio signal SR10, and second subband signal generator SG100*b* is configured to produce a set of second subband signals based on information from noise estimate N10. Equalizer EQ20 also includes a first subband power estimate calculator EC100*a* and a second subband power estimate calculator EC100*a*. First subband power estimate calculator EC100*a* is configured to produce a set of first subband power estimates, each based on information from a corresponding one of the first subband signals, and second subband power estimate calculator EC100*b* is configured to produce a set of second subband power estimates, each based on information from a corresponding one of the second subband signals. Equalizer EQ20 also includes a subband gain factor calculator GC100 that is configured to calculate a gain factor for each of the subbands, based on a relation between a corresponding first subband power estimate and a corresponding second subband power estimate, and a subband filter array FA100 that is configured to filter reproduced audio signal SR10 according to the subband gain factors to produce equalized audio signal SQ10. Further examples of implementation and operation of equalizer EQ10 may be found, for example, in US Publ. Pat. Appl. No. 2010/0017205, published Jan. 21, 2010, entitled "SYSTEMS, METHODS, APPARATUS, AND COMPUTER PROGRAM PRODUCTS FOR ENHANCED INTELLIGIBILITY."

It may be desirable to perform an echo cancellation operation on sensed multichannel audio signal SS20, based on information from equalized audio signal EQ10. For example, such an operation may be performed within an implementation of audio preprocessor AP10 as described herein. If noise estimate N10 includes uncanceled acoustic echo from audio output signal AO10, then a positive feedback loop may be created between equalized audio signal SQ10 and the subband gain factor computation path, such that the higher the level of equalized audio signal SQ10 in an acoustic signal based on audio output signal SO10 (e.g., as reproduced by a loudspeaker of the device), the more that equalizer EQ10 will tend to increase the subband gain factors.

Either or both of subband signal generators SG100*a* and SG100*b* may be configured to produce a set of q subband signals by grouping bins of a frequency-domain signal into the q subbands according to a desired subband division scheme. Alternatively, either or both of subband signal generators SG100*a* and SG100*b* may be configured to filter a time-domain signal (e.g., using a subband filter bank) to produce a set of q subband signals according to a desired subband division scheme. The subband division scheme may be uniform, such that each bin has substantially the same width (e.g., within about ten percent). Alternatively, the subband division scheme may be nonuniform, such as a transcendental scheme (e.g., a scheme based on the Bark scale) or a logarithmic scheme (e.g., a scheme based on the Mel scale). In one example, the edges of a set of seven Bark scale subbands correspond to the frequencies 20, 300, 630, 1080, 1720, 2700, 4400, and 7700 Hz. Such an arrangement of subbands may be used in a wideband speech processing system that has a sampling rate of 16 kHz. In other examples of such a division scheme, the lower subband is omitted to obtain a six-subband arrangement and/or the high-frequency limit is increased from 7700 Hz to 8000 Hz. Another example of a subband division scheme is the four-band quasi-Bark scheme 300-510 Hz, 510-920 Hz, 920-1480 Hz, and 1480-4000 Hz. Such an arrangement of subbands may be used in a narrowband speech processing system that has a sampling rate of 8 kHz.

Each of subband power estimate calculators EC100*a* and EC100*b* is configured to receive the respective set of subband signals and to produce a corresponding set of subband power estimates (typically for each frame of reproduced audio signal SR10 and noise estimate N10). Either or both of subband power estimate calculators EC100*a* and EC100*b* may be configured to calculate each subband power estimate as a sum of the squares of the values of the corresponding subband signal for that frame. Alternatively, either or both of subband power estimate calculators EC100*a* and EC100*b* may be configured to calculate each subband power estimate as a sum of the magnitudes of the values of the corresponding subband signal for that frame.

It may be desirable to implement either of both of subband power estimate calculators EC100*a* and EC100*b* to calculate a power estimate for the entire corresponding signal for each frame (e.g., as a sum of squares or magnitudes), and to use this power estimate to normalize the subband power estimates for that frame. Such normalization may be performed by dividing each subband sum by the signal sum, or subtracting the signal sum from each subband sum. (In the case of division, it may be desirable to add a small value to the signal sum to avoid a division by zero.) Alternatively or additionally, it may be desirable to implement either of both of subband power estimate calculators EC100*a* and EC100*b* to perform a temporal smoothing operation of the subband power estimates.

Subband gain factor calculator GC100 is configured to calculate a set of gain factors for each frame of reproduced audio signal SR10, based on the corresponding first and second subband power estimate. For example, subband gain factor calculator GC100 may be configured to calculate each gain factor as a ratio of a noise subband power estimate to the corresponding signal subband power estimate. In such case, it may be desirable to add a small value to the signal subband power estimate to avoid a division by zero.

Subband gain factor calculator GC100 may also be configured to perform a temporal smoothing operation on each of one or more (possibly all) of the power ratios. It may be desirable for this temporal smoothing operation to be configured to allow the gain factor values to change more quickly when the degree of noise is increasing and/or to inhibit rapid changes in the gain factor values when the degree of noise is decreasing. Such a configuration may help to counter a psychoacoustic temporal masking effect in which a loud noise continues to mask a desired sound even after the noise has ended. Accordingly, it may be desirable to vary the value of the smoothing factor according to a relation between the current and previous gain factor values (e.g., to perform more smoothing when the current value of the gain factor is less than the previous value, and less smoothing when the current value of the gain factor is greater than the previous value).

Alternatively or additionally, subband gain factor calculator GC100 may be configured to apply an upper bound and/or a lower bound to one or more (possibly all) of the subband gain factors. The values of each of these bounds may be fixed. Alternatively, the values of either or both of these bounds may be adapted according to, for example, a desired headroom for equalizer EQ10 and/or a current volume of equalized audio signal SQ10 (e.g., a current user-controlled value of a volume control signal). Alternatively or additionally, the values of either or both of these bounds may be based on information from reproduced audio signal SR10, such as a current level of reproduced audio signal SR10.

It may be desirable to configure equalizer EQ10 to compensate for excessive boosting that may result from an overlap of subbands. For example, subband gain factor calculator GC100 may be configured to reduce the value of one or more of the mid-frequency subband gain factors (e.g., a subband that includes the frequency fs/4, where fs denotes the sampling frequency of reproduced audio signal SR10). Such an implementation of subband gain factor calculator GC100 may be configured to perform the reduction by multiplying the current value of the subband gain factor by a scale factor having a value of less than one. Such an implementation of subband gain factor calculator GC100 may be configured to use the same scale factor for each subband gain factor to be scaled down or, alternatively, to use different scale factors for each subband gain factor to be scaled down (e.g., based on the degree of overlap of the corresponding subband with one or more adjacent subbands).

Additionally or in the alternative, it may be desirable to configure equalizer EQ10 to increase a degree of boosting of one or more of the high-frequency subbands. For example, it may be desirable to configure subband gain factor calculator GC100 to ensure that amplification of one or more high-frequency subbands of reproduced audio signal SR10 (e.g., the highest subband) is not lower than amplification of a mid-frequency subband (e.g., a subband that includes the frequency fs/4, where fs denotes the sampling frequency of reproduced audio signal S40). In one such example, subband gain factor calculator GC100 is configured to calculate the current value of the subband gain factor for a high-frequency subband by multiplying the current value of the subband gain factor for a mid-frequency subband by a scale factor that is greater than one. In another such example, subband gain factor calculator GC100 is configured to calculate the current value of the subband gain factor for a high-frequency subband as the maximum of (A) a current gain factor value that is calculated from the power ratio for that subband and (B) a value obtained by multiplying the current value of the subband gain factor for a mid-frequency subband by a scale factor that is greater than one.

Figure 23A:
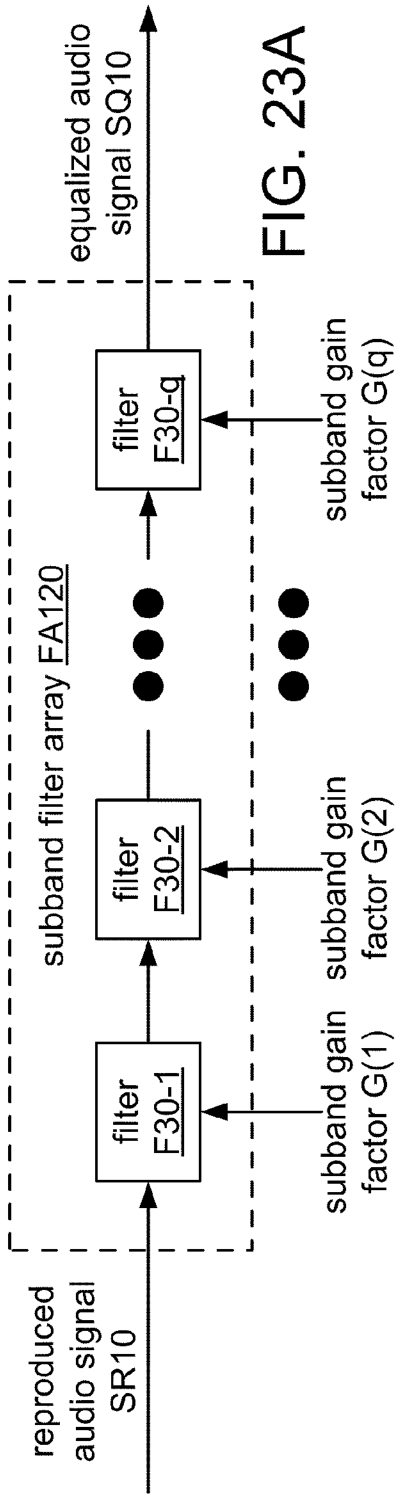
FIG. 23A shows a block diagram of an implementation FA120 of subband filter array FA100.

Subband filter array FA100 is configured to apply each of the subband gain factors to a corresponding subband of reproduced audio signal SR10 to produce equalized audio signal SQ10. Subband filter array FA100 may be implemented to include an array of bandpass filters, each configured to apply a respective one of the subband gain factors to a corresponding subband of reproduced audio signal SR10. The filters of such an array may be arranged in parallel and/or in serial. FIG. 23A shows a block diagram of an implementation FA120 of subband filter array FA100 in which the bandpass filters F30-1 to F30-*q* are arranged to apply each of the subband gain factors G(1) to G(q) to a corresponding subband of reproduced audio signal SR10 by filtering reproduced audio signal SR10 according to the subband gain factors in serial (i.e., in a cascade, such that each filter F30-*k* is arranged to filter the output of filter F30-(*k*-1) for $2 \le k \le q$).

Each of the filters F30-1 to F30-*q* may be implemented to have a finite impulse response (FIR) or an infinite impulse response (IIR). For example, each of one or more (possibly all) of filters F30-1 to F30-*q* may be implemented as a second-order IIR section or "biquad". The transfer function of a biquad may be expressed as $$H(z) = \frac{b_0 + b_1 z^{-1} + b_2 z^{-2}}{1 + a_1 z^{-1} + a_2 z^{-2}}. \quad (1)$$

Figure 23B:
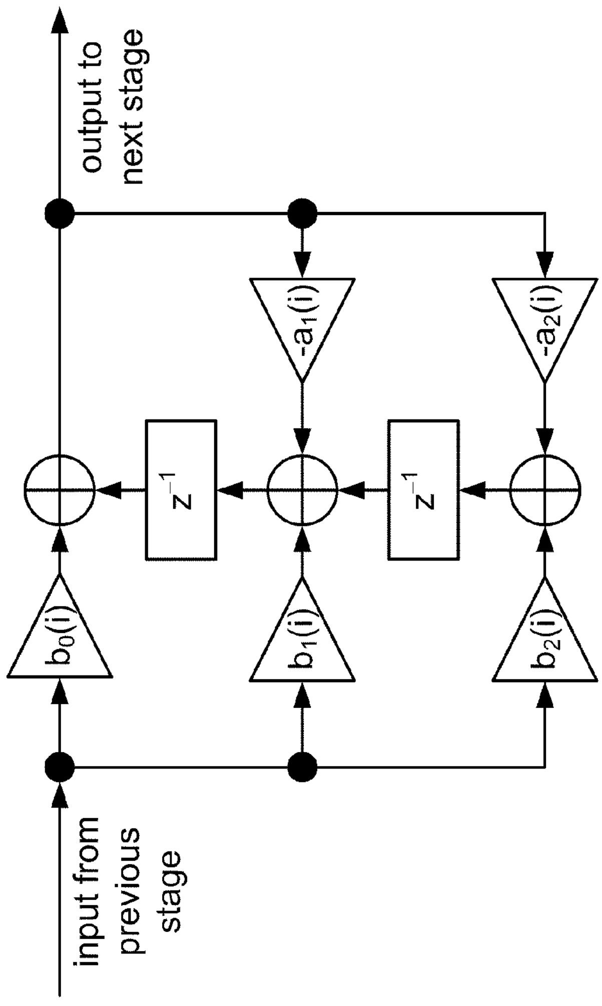
FIG. 23B shows a block diagram of a transposed direct form II implementation of a cascaded biquad filter.
Figure 24:
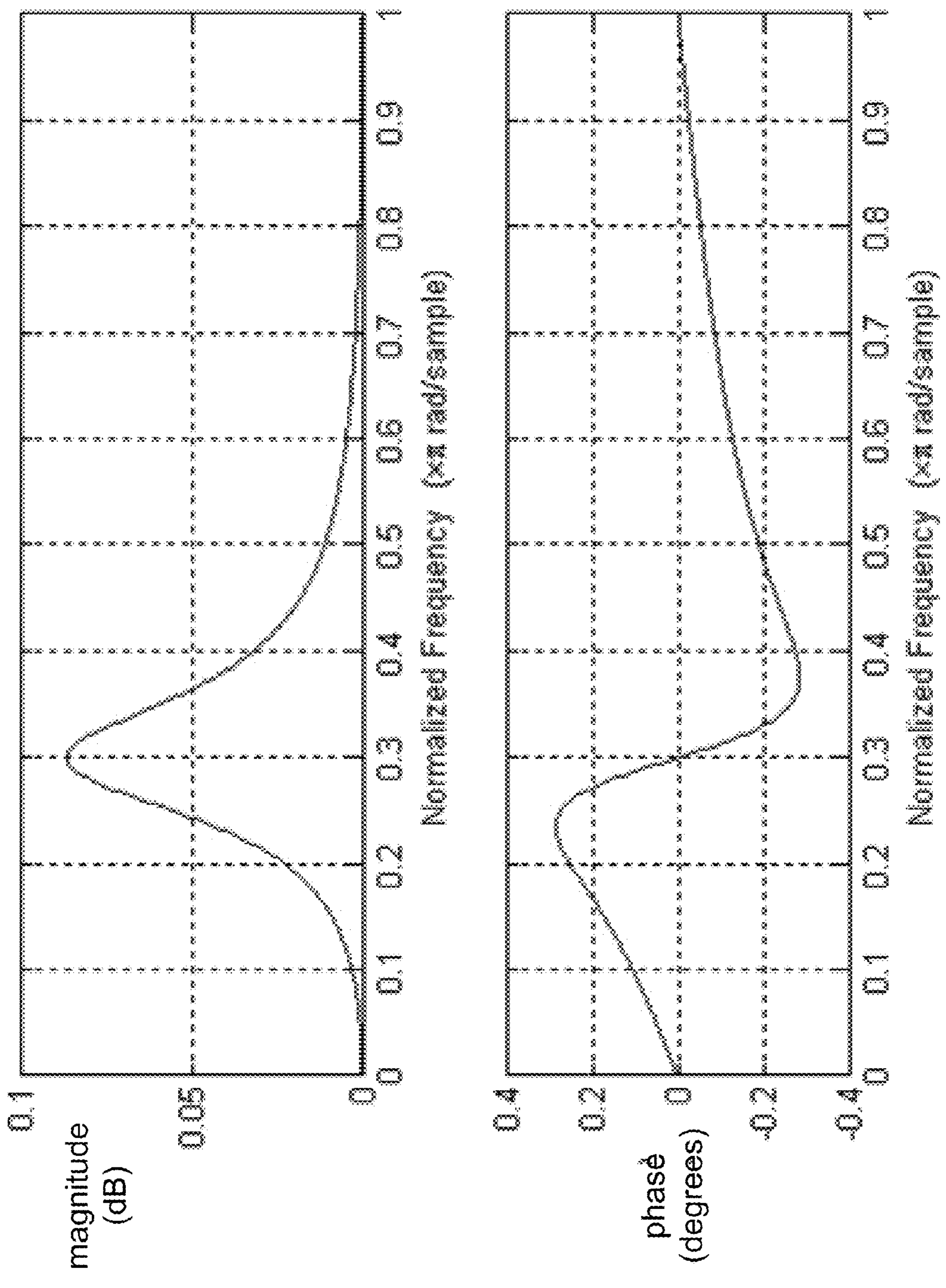
FIG. 24 shows magnitude and phase responses for a biquad peaking filter.

It may be desirable to implement each biquad using the transposed direct form II, especially for floating-point implementations of equalizer EQ10. FIG. 23B illustrates a transposed direct form II structure for a biquad implementation of one F30-*i* of filters F30-1 to F30-*q*. FIG. 24 shows magnitude and phase response plots for one example of a biquad implementation of one of filters F30-1 to F30-*q*.

Subband filter array FA120 may be implemented as a cascade of biquads. Such an implementation may also be referred to as a biquad IIR filter cascade, a cascade of second-order IIR sections or filters, or a series of subband IIR biquads in cascade. It may be desirable to implement each biquad using the transposed direct form II, especially for floating-point implementations of equalizer EQ10.

Figure 25:
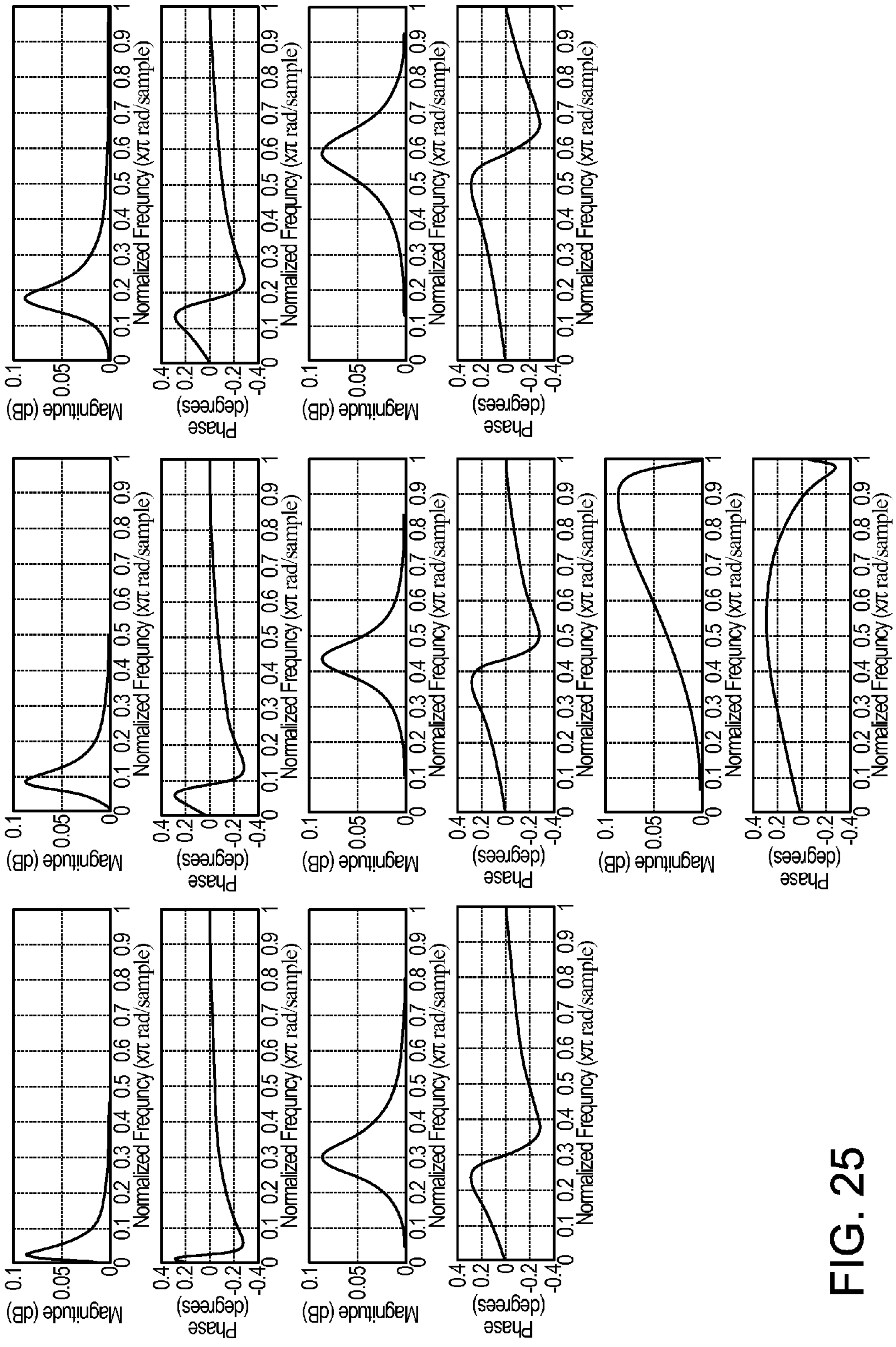
FIG. 25 shows magnitude and phase responses for each of a set of seven biquads in a cascade implementation of subband filter array FA120.

It may be desirable for the passbands of filters F30-1 to F30-*q* to represent a division of the bandwidth of reproduced audio signal SR10 into a set of nonuniform subbands (e.g., such that two or more of the filter passbands have different widths) rather than a set of uniform subbands (e.g., such that the filter passbands have equal widths). It may be desirable for subband filter array FA120 to apply the same subband division scheme as an implementation of subband filter array SG30 of first subband signal generator SG100*a* and/or an implementation of a subband filter array SG30 of second subband signal generator SG100*b*. Subband filter array FA120 may even be implemented using the same component filters as such a subband filter array or arrays (e.g., at different times and with different gain factor values), FIG. 25 shows magnitude and phase responses for each of a set of seven biquads in a cascade implementation of subband filter array FA120 for a Bark-scale subband division scheme as described above.

Each of the subband gain factors G(1) to G(q) may be used to update one or more filter coefficient values of a corresponding one of filters F30-1 to F30-*q*. In such case, it may be desirable to configure each of one or more (possibly all) of the filters F30-1 to F30-*q* such that its frequency characteristics (e.g., the center frequency and width of its passband) are fixed and its gain is variable. Such a technique may be implemented for an FIR or IIR filter by varying only the values of one or more of the feedforward coefficients (e.g., the coefficients $b_0$, $b_1$, and $b_2$ in biquad expression (1) above). In one example, the gain of a biquad implementation of one F30-*i* of filters F30-1 to F30-*q* is varied by adding an offset g to the feedforward coefficient $b_0$ and subtracting the same offset g from the feedforward coefficient $b_2$ to obtain the following transfer function:

$$H_i(z) = \frac{(b_0(i) + g) + b_1(i) z^{-1} + (b_2(i) - g) z^{-2}}{1 + a_1(i) z^{-1} + a_2(i) z^{-2}}. \quad (2)$$

Figure 26:
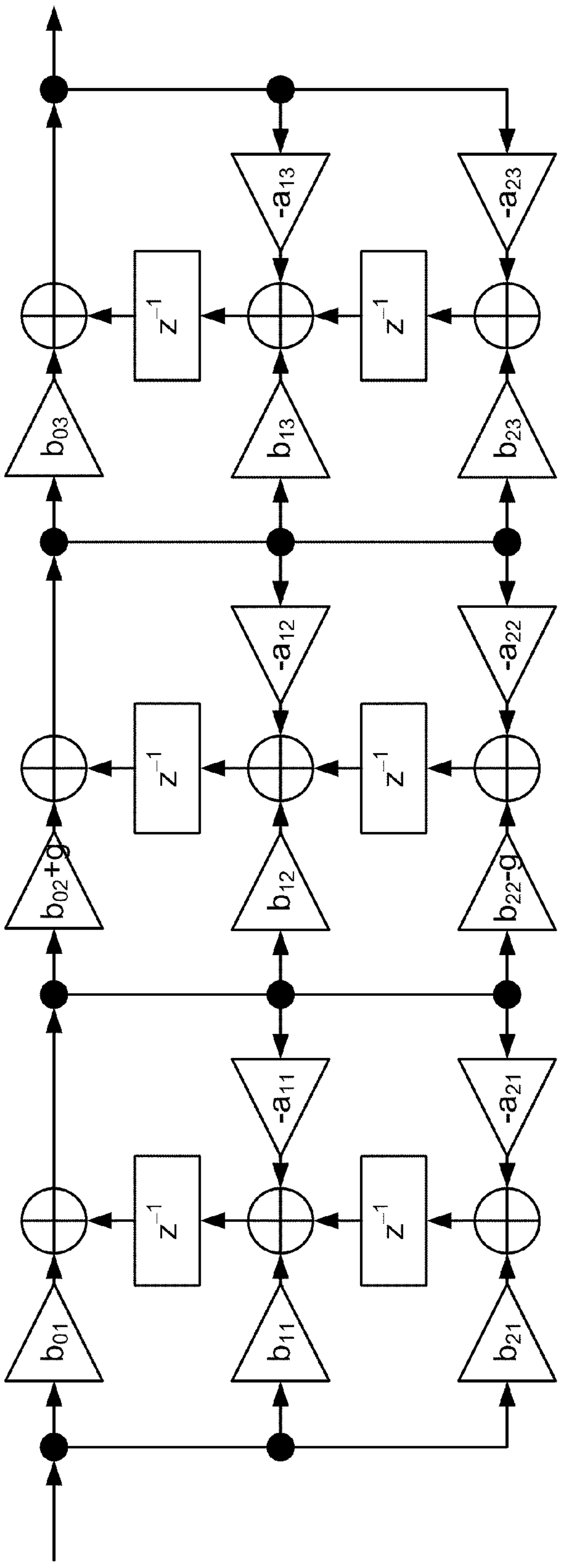
FIG. 26 shows a block diagram of an example of a three-stage biquad cascade implementation of subband filter array FA120.

In this example, the values of $a_1$ and $a_2$ are selected to define the desired band, the values of $a_2$ and $b_2$ are equal, and $b_0$ is equal to one. The offset g may be calculated from the corresponding gain factor G(i) according to an expression such as $g=(1-a_2(i))(G(i)-1)c$, where c is a normalization factor having a value less than one that may be tuned such that the desired gain is achieved at the center of the band. FIG. 26 shows such an example of a three-stage cascade of biquads, in which an offset g is being applied to the second stage.

It may be desirable to configure equalizer EQ10 to pass one or more subbands of reproduced audio signal SR10 without boosting. For example, boosting of a low-frequency subband may lead to muffling of other subbands, and it may be desirable for equalizer EQ10 to pass one or more low-frequency subbands of reproduced audio signal SR10 (e.g., a subband that includes frequencies less than 300 Hz) without boosting.

It may be desirable to bypass equalizer EQ10, or to otherwise suspend or inhibit equalization of reproduced audio signal SR10, during intervals in which reproduced audio signal SR10 is inactive. In one such example, apparatus A100 is configured to include a voice activity detection operation (e.g., according to any of the examples described herein) on reproduced audio signal S40 that is arranged to control equalizer EQ10 (e.g., by allowing the subband gain factor values to decay when reproduced audio signal SR10 is inactive).

Apparatus A100 may be configured to include an automatic gain control (AGC) module that is arranged to compress the dynamic range of reproduced audio signal SR10 before equalization. Such a module may be configured to provide a headroom definition and/or a master volume setting (e.g., to control upper and/or lower bounds of the subband gain factors). Alternatively or additionally, apparatus A100 may be configured to include a peak limiter arranged to limit the acoustic output level of equalizer EQ10 (e.g., to limit the level of equalized audio signal SQ10).

Apparatus A100 also includes an audio output stage AO10 that is configured to combine anti-noise signal SA10 and equalized audio signal SQ10 to produce an audio output signal SO10. For example, audio output stage AO10 may be implemented as a mixer that is configured to produce audio output signal SO10 by mixing anti-noise signal SA10 with equalized audio signal SQ10. Audio output stage AO10 may also be configured to produce audio output signal SO10 by converting anti-noise signal SA10, equalized audio signal SQ10, or a mixture of the two signals from a digital form to an analog form and/or by performing any other desired audio processing operation on such a signal (e.g., filtering, amplifying, applying a gain factor to, and/or controlling a level of such a signal). Audio output stage AO10 may also be configured to provide impedance matching to a loudspeaker or other electrical, optical, or magnetic interface that is arranged to receive or transfer audio output signal SO10 (e.g., an audio output jack).

Figure 1B:
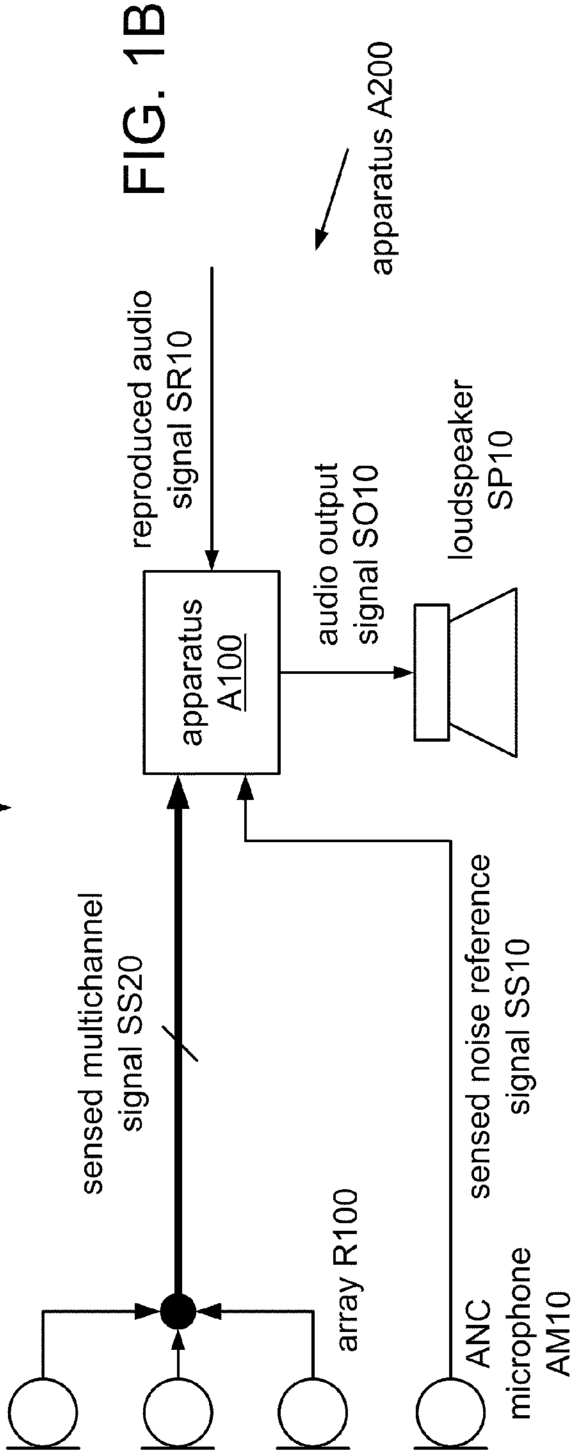
FIG. 1B shows a block diagram of an implementation A200 of apparatus A100.

Apparatus A100 is typically configured to play audio output signal SO10 (or a signal based on signal SO10) through a loudspeaker, which may be directed at the user's ear. FIG. 1B shows a block diagram of an apparatus A200 that includes an implementation of apparatus A100. In this example, apparatus A100 is arranged to receive sensed multichannel signal SS20 via the microphones of array R100 and to receive sensed noise reference signal SS10 via ANC microphone AM10. Audio output signal SO10 is used to drive a loudspeaker SP10 that is typically directed at the user's ear.

It may be desirable to locate the microphones that produce multichannel sensed audio signal SS20 as far away from loudspeaker SP10 as possible (e.g., to reduce acoustic coupling). Also, it may be desirable to locate the microphones that produce multichannel sensed audio signal SS20 so that they are exposed to external noise. Regarding the ANC microphone or microphones AM10 that produce sensed noise reference signal SS10, it may be desirable to locate this microphone or these microphones as close to the ear as possible, perhaps even in the ear canal.

Apparatus A200 may be constructed as a feedforward device, such that ANC microphone AM10 is positioned to sense the ambient acoustic environment. Another type of ANC device uses a microphone to pick up an acoustic error signal (also called a "residual" or "residual error" signal) after the noise reduction, and feeds this error signal back to the ANC filter. This type of ANC system is called a feedback ANC system. An ANC filter in a feedback ANC system is typically configured to reverse the phase of the error feedback signal and may also be configured to integrate the error feedback signal, equalize the frequency response, and/or to match or minimize the delay.

In a feedback ANC system, it may be desirable for the error feedback microphone to be disposed within the acoustic field generated by the loudspeaker. Apparatus A200 may be constructed as a feedback device, such that ANC microphone AM10 is positioned to sense the sound within a chamber that encloses the opening of the user's auditory canal and into which loudspeaker SP10 is driven. For example, it may be desirable for the error feedback microphone to be disposed with the loudspeaker within the earcup of a headphone. It may also be desirable for the error feedback microphone to be acoustically insulated from the environmental noise.

Figure 2B:
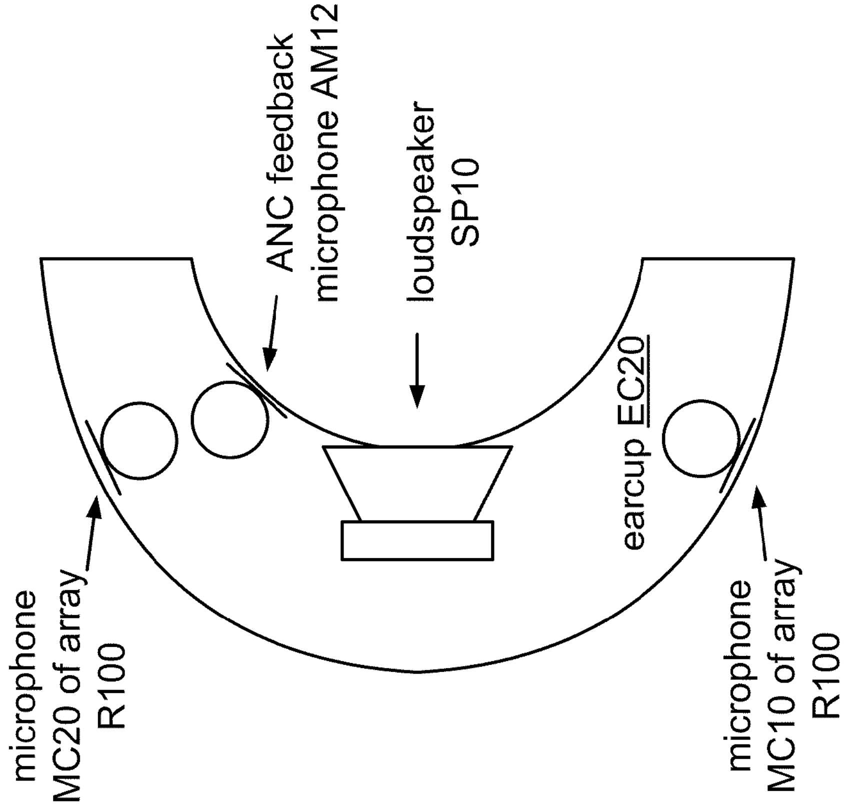
FIG. 2B shows a cross-section of an implementation EC20 of earcup EC10.
Figure 2A:
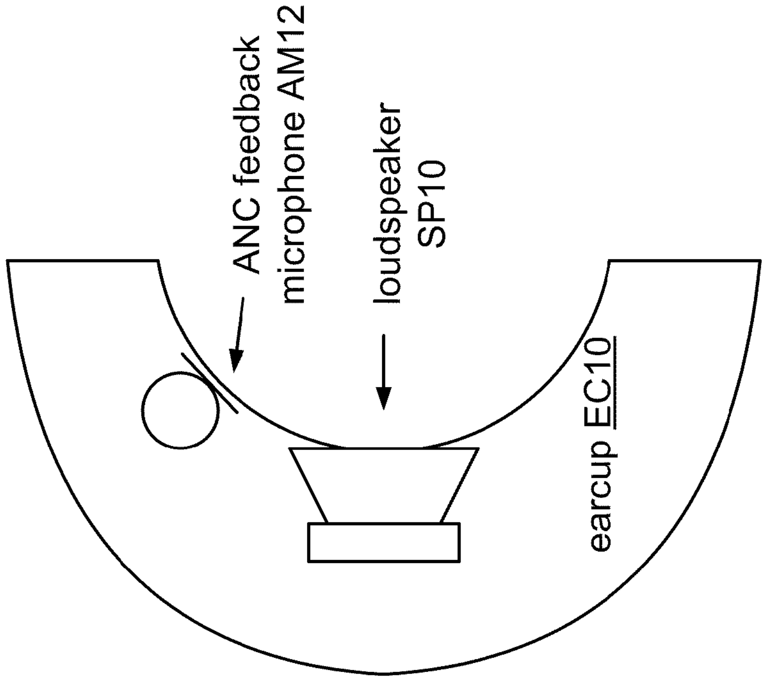
FIG. 2A shows a cross-section of an earcup EC10.

FIG. 2A shows a cross-section of an earcup EC10 that may be implemented to include apparatus A100 (e.g., to include apparatus A200). Earcup EC10 includes a loudspeaker SP10 that is arranged to reproduce audio output signal SO10 to the user's ear and a feedback implementation AM12 of ANC microphone AM10 that is directed at the user's ear and arranged to receive sensed noise reference signal SS10 as an acoustic error signal (e.g., via an acoustic port in the earcup housing). It may be desirable in such case to insulate the ANC microphone from receiving mechanical vibrations from loudspeaker SP10 through the material of the earcup. FIG. 2B shows a cross-section of an implementation EC20 of earcup EC10 that includes microphones MC10 and MC20 of array R100. In this case, it may be desirable to position microphone MC10 to be as close as possible to the user's mouth during use.

An ANC device, such as an earcup (e.g., device EC10 or EC20) or headset (e.g., device D100 or D200 as described below), may be implemented to produce a monophonic audio signal. Alternatively, such a device may be implemented to produce a respective channel of a stereophonic signal at each of the user's ears (e.g., as stereo earphones or a stereo headset). In this case, the housing at each ear carries a respective instance of loudspeaker SP10. It may also be desirable to include one or more microphones at each ear to produce a respective instance of sensed noise reference signal SS10 for that ear, and to include a respective instance of ANC filter F10 to process it to produce a corresponding instance of anti-noise signal SA10. Respective instances of an array to produce multichannel sensed audio signal SS20 are also possible; alternatively, it may be sufficient to use the same signal SS20 (e.g., the same noise estimate N10) for both ears. For a case in which reproduced audio signal SR10 is stereophonic, equalizer EQ10 may be implemented to process each channel separately according to noise estimate N10.

It will be understood that apparatus A200 will typically be configured to perform one or more preprocessing operations on the signals produced by microphone array R100 and/or ANC microphone AM10 to obtain sensed noise reference signal SS10 and sensed multichannel signal SS20, respectively. For example, in a typical case the microphones will be configured to produce analog signals, while ANC filter F10 and/or spatially selective filter F20 may be configured to operate on digital signals, such that the preprocessing operations will include analog-to-digital conversion. Examples of other preprocessing operations that may be performed on the microphone channels in the analog and/or digital domain include bandpass filtering (e.g., lowpass filtering). Likewise, audio output stage AO10 may be configured to perform one or more postprocessing operations (e.g., filtering, amplifying, and/or converting from digital to analog, etc.) to produce audio output signal SO10.

It may be desirable to produce an ANC device that has an array R100 of two or more microphones configured to receive acoustic signals. Examples of a portable ANC device that may be implemented to include such an array and may be used for voice communications and/or multimedia applications include a hearing aid, a wired or wireless headset (e.g., a Bluetooth™ headset), and a personal media player configured to play audio and/or video content.

Each microphone of array R100 may have a response that is omnidirectional, bidirectional, or unidirectional (e.g., cardioid). The various types of microphones that may be used in array R100 include (without limitation) piezoelectric microphones, dynamic microphones, and electret microphones. In a device for portable voice communications, such as a handset or headset, the center-to-center spacing between adjacent microphones of array R100 is typically in the range of from about 1.5 cm to about 4.5 cm, although a larger spacing (e.g., up to 10 or 15 cm) is also possible in a device such as a handset. In a hearing aid, the center-to-center spacing between adjacent microphones of array R100 may be as little as about 4 or 5 mm. The microphones of array R100 may be arranged along a line or, alternatively, such that their centers lie at the vertices of a two-dimensional (e.g., triangular) or three-dimensional shape.

During the operation of a multi-microphone ANC device, array R100 produces a multichannel signal in which each channel is based on the response of a corresponding one of the microphones to the acoustic environment. One microphone may receive a particular sound more directly than another microphone, such that the corresponding channels differ from one another to provide collectively a more complete representation of the acoustic environment than can be captured using a single microphone.

Figures 3A, 3B, 3C:
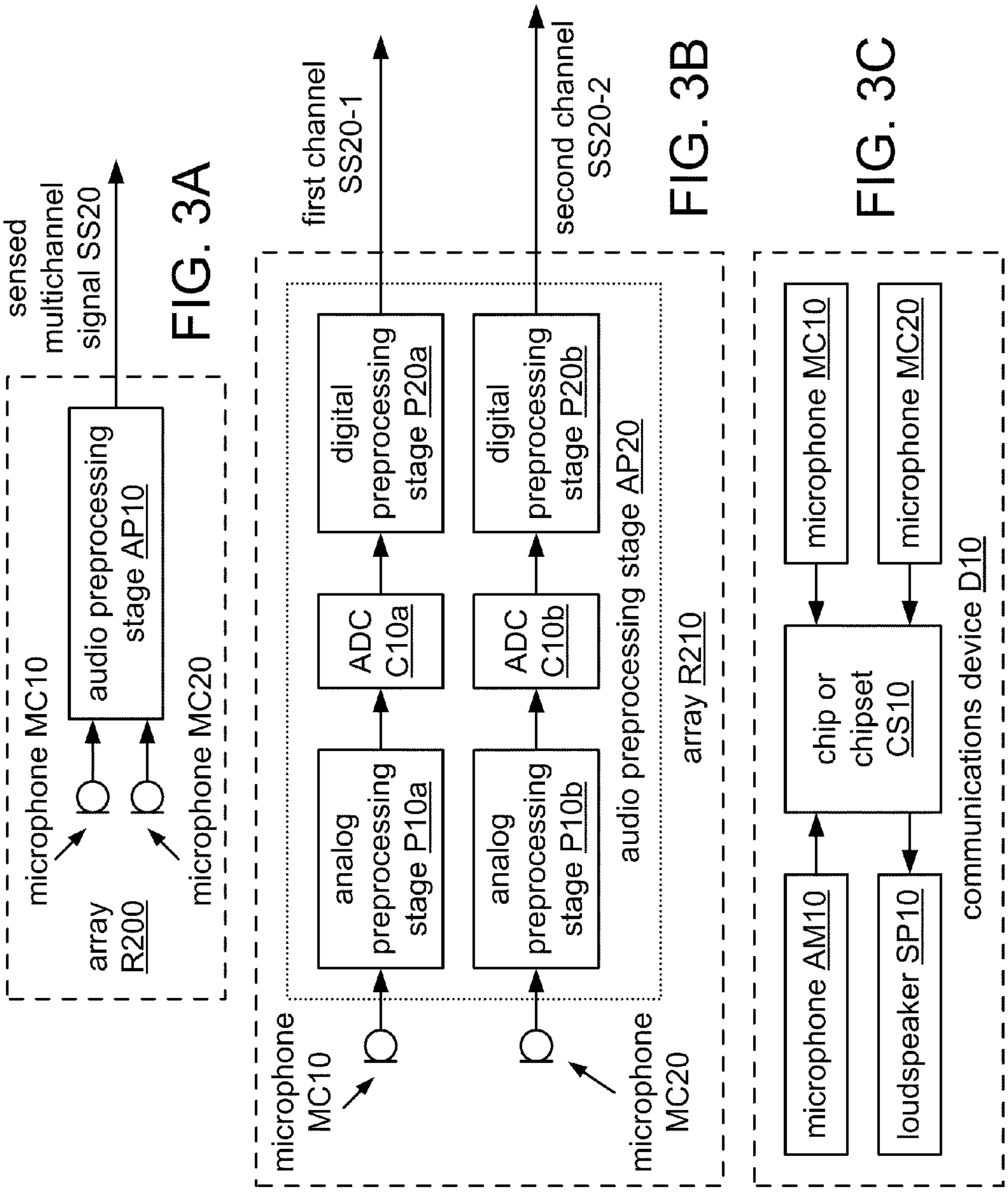
FIG. 3A shows a block diagram of an implementation R200 of array R100.
FIG. 3B shows a block diagram of an implementation R210 of array R200.
FIG. 3C shows a block diagram of a communications device D10 according to a general configuration.

It may be desirable for array R100 to perform one or more processing operations on the signals produced by the microphones to produce sensed multichannel signal SS20. FIG. 3A shows a block diagram of an implementation R200 of array R100 that includes an audio preprocessing stage AP10 configured to perform one or more such operations, which may include (without limitation) impedance matching, analog-to-digital conversion, gain control, and/or filtering in the analog and/or digital domains.

FIG. 3B shows a block diagram of an implementation R210 of array R200. Array R210 includes an implementation AP20 of audio preprocessing stage AP10 that includes analog preprocessing stages P10$a$ and P10$b$. In one example, stages P10$a$ and P10$b$ are each configured to perform a highpass filtering operation (e.g., with a cutoff frequency of 50, 100, or 200 Hz) on the corresponding microphone signal.

It may be desirable for array R100 to produce the multichannel signal as a digital signal, that is to say, as a sequence of samples. Array R210, for example, includes analog-to-digital converters (ADCs) C10$a$ and C10$b$ that are each arranged to sample the corresponding analog channel. Typical sampling rates for acoustic applications include 8 kHz, 12 kHz, 16 kHz, and other frequencies in the range of from about 8 to about 16 kHz, although sampling rates as high as 1 MHZ (e.g., about 44 kHz or 192 kHz) may also be used. In this particular example, array R210 also includes digital preprocessing stages P20$a$ and P20$b$ that are each configured to perform one or more preprocessing operations (e.g., echo cancellation, noise reduction, and/or spectral shaping) on the corresponding digitized channel. Of course, it will typically be desirable for an ANC device to include a preprocessing stage similar to audio preprocessing stage AP10 that is configured to perform one or more (possibly all) of such preprocessing operations on the signal produced by ANC microphone AM10 to produce sensed noise reference signal SS10.

Apparatus A100 may be implemented in hardware and/or in software (e.g., firmware). FIG. 3C shows a block diagram of a communications device D10 according to a general configuration. Any of the ANC devices disclosed herein may be implemented as an instance of device D10. Device D10 includes a chip or chipset CS10 that includes an implementation of apparatus A100 as described herein. Chip/chipset CS10 may include one or more processors, which may be configured to execute all or part of apparatus A100 (e.g., as instructions). Chip/chipset CS10 may also include processing elements of array R100 (e.g., elements of audio preprocessing stage AP10).

Chip/chipset CS10 may also include a receiver, which is configured to receive a radio-frequency (RF) communications signal via a wireless transmission channel and to decode an audio signal encoded within the RF signal (e.g., reproduced audio signal SR10), and a transmitter, which is configured to encode an audio signal that is based on a processed signal produced by apparatus A100 and to transmit an RF communications signal that describes the encoded audio signal. For example, one or more processors of chip/chipset CS10 may be configured to process one or more channels of sensed multichannel signal SS20 such that the encoded audio signal includes audio content from sensed multichannel signal SS20. In such case, chip/chipset CS10 may be implemented as a Bluetooth™ and/or mobile station modem (MSM) chipset.

Implementations of apparatus A100 as described herein may be embodied in a variety of ANC devices, including headsets and earcups (e.g., device EC10 or EC20). An earpiece or other headset having one or more microphones is one kind of portable communications device that may include an implementation of an ANC apparatus as described herein. Such a headset may be wired or wireless. For example, a wireless headset may be configured to support half- or full-duplex telephony via communication with a telephone device such as a cellular telephone handset (e.g., using a version of the Bluetooth™ protocol as promulgated by the Bluetooth Special Interest Group, Inc., Bellevue, Wash.).

Figures 4A, 4B, 4C, 4D:
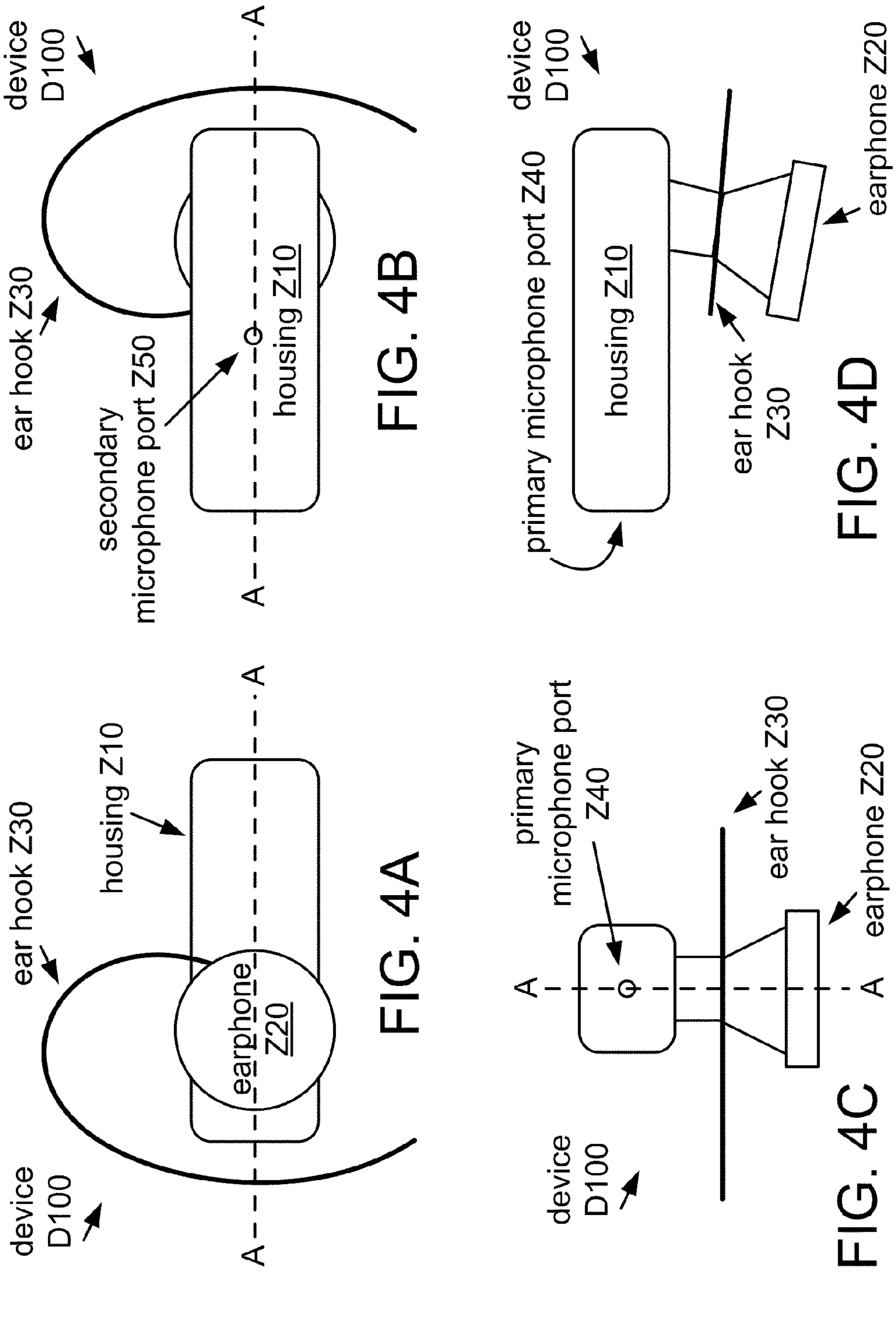
FIGS. 4A to 4D show various views of a multi-microphone portable audio sensing device D100.

FIGS. 4A to 4D show various views of a multi-microphone portable audio sensing device D100 that may include an implementation of an ANC apparatus as described herein. Device D100 is a wireless headset that includes a housing Z10 which carries an implementation of multimicrophone array R100 and an earphone Z20 that includes loudspeaker SP10 and extends from the housing. In general, the housing of a headset may be rectangular or otherwise elongated as shown in FIGS. 4A, 4B, and 4D (e.g., shaped like a miniboom) or may be more rounded or even circular. The housing may also enclose a battery and a processor and/or other processing circuitry (e.g., a printed circuit board and components mounted thereon) and may include an electrical port (e.g., a mini-Universal Serial Bus (USB) or other port for battery charging) and user interface features such as one or more button switches and/or LEDs. Typically the length of the housing along its major axis is in the range of from one to three inches.

Typically each microphone of array R100 is mounted within the device behind one or more small holes in the housing that serve as an acoustic port. FIGS. 4B to 4D show the locations of the acoustic port Z40 for the primary microphone of a two-microphone array of device D100 and the acoustic port Z50 for the secondary microphone of this array, which may be used to produce multichannel sensed audio signal SS20. In this example, the primary and secondary microphones are directed away from the user's ear to receive external ambient sound.

Figure 5:
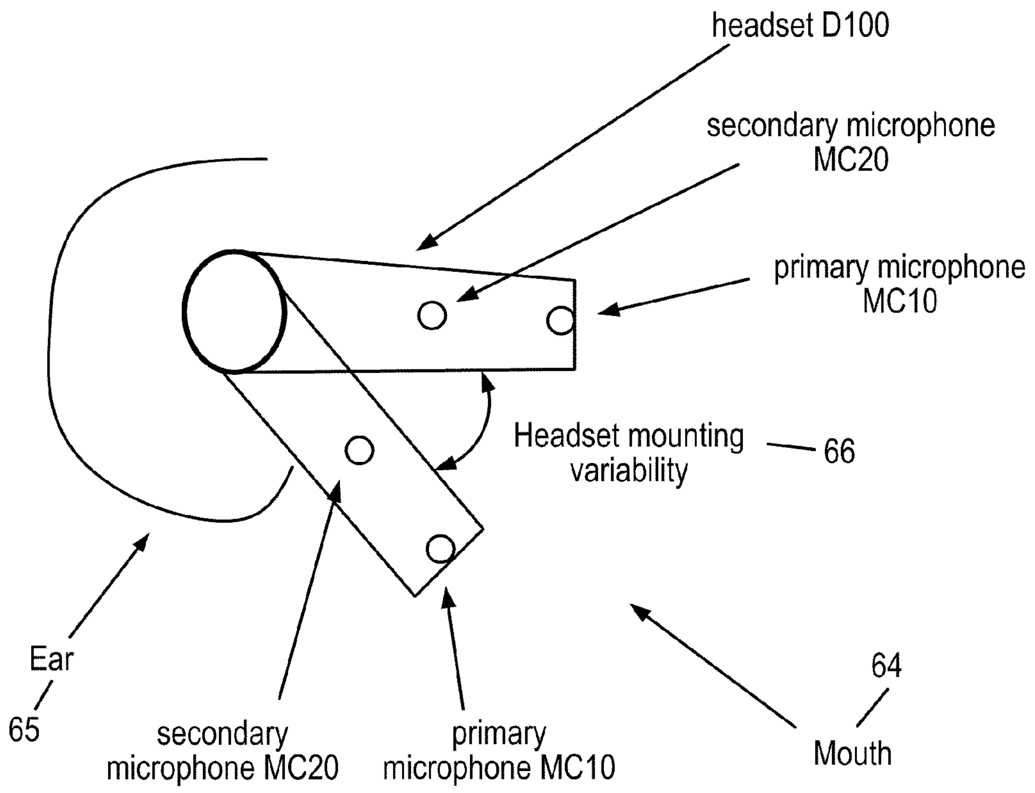
FIG. 5 shows a diagram of a range 66 of different operating configurations of a headset.
Figure 6:
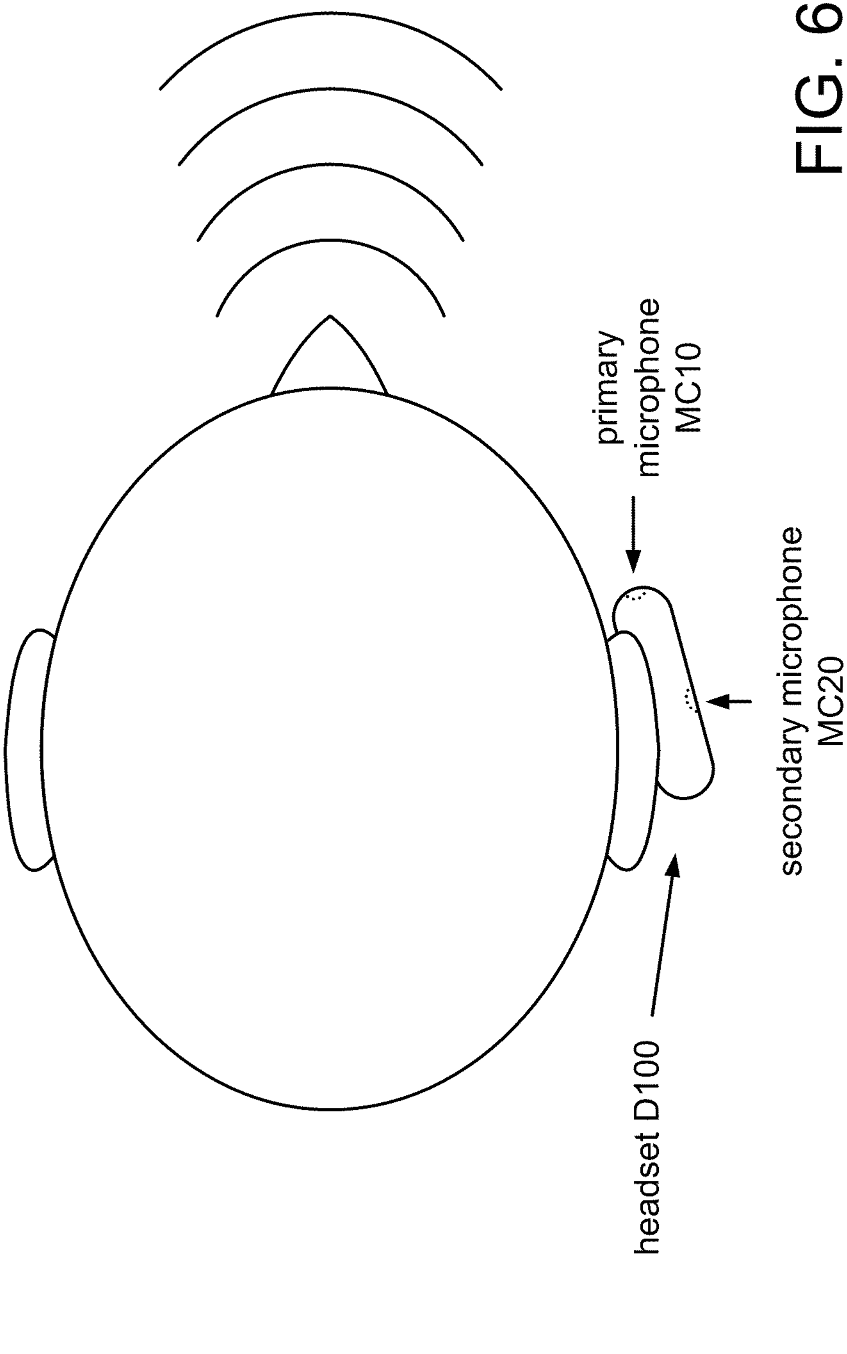
FIG. 6 shows a top view of a headset mounted on a user's ear.

FIG. 5 shows a diagram of a range 66 of different operating configurations of a headset D100 during use, with headset D100 being mounted on the user's ear 65 and variously directed toward the user's mouth 64. FIG. 6 shows a top view of headset D100 mounted on a user's ear in a standard orientation relative to the user's mouth.

Figure 7A:
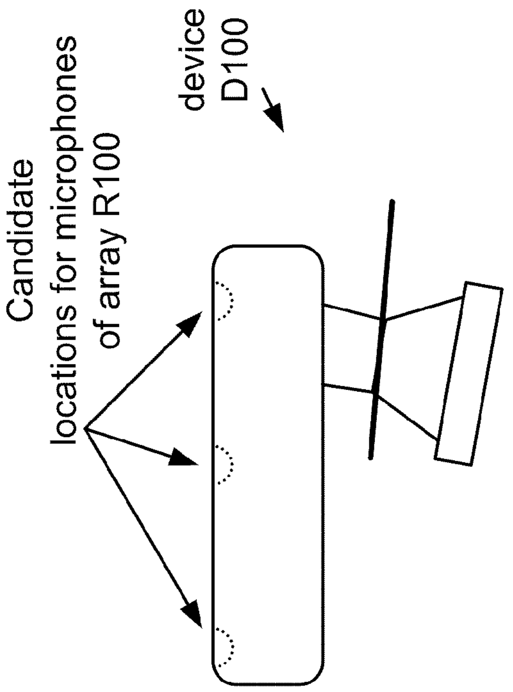
FIG. 7A shows three examples of locations within device D100 at which microphones of an array used to capture channels of sensed multichannel audio signal SS20 may be located.
Figure 7B:
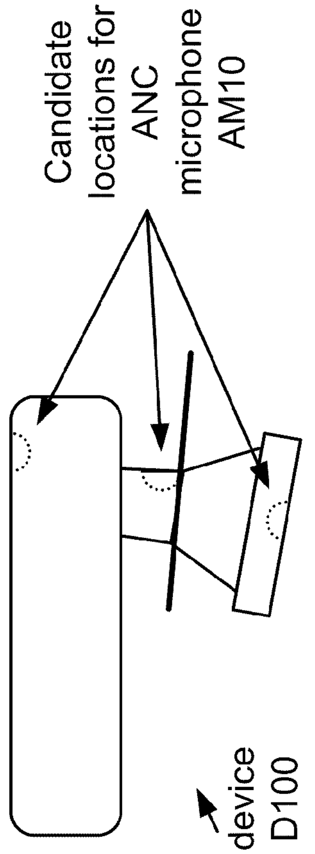
FIG. 7B shows three examples of locations within device D100 at which a microphone or microphones used to capture sensed noise reference signal SS10 may be located.

FIG. 7A shows several candidate locations at which the microphones of array R100 may be disposed within headset D100. In this example, the microphones of array R100 are directed away from the user's ear to receive external ambient sound. FIG. 7B shows several candidate locations at which ANC microphone AM10 (or at which each of two or more instances of ANC microphone AM10) may be disposed within headset D100.

Figure 8B:
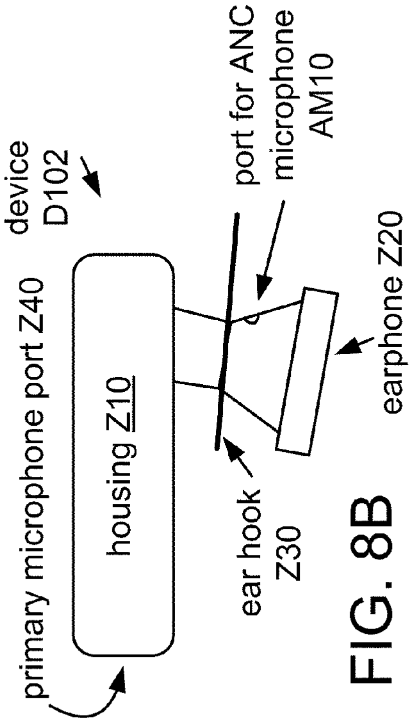
FIGS. 8A and 8B show various views of an implementation D102 of device D100.
Figure 8A:
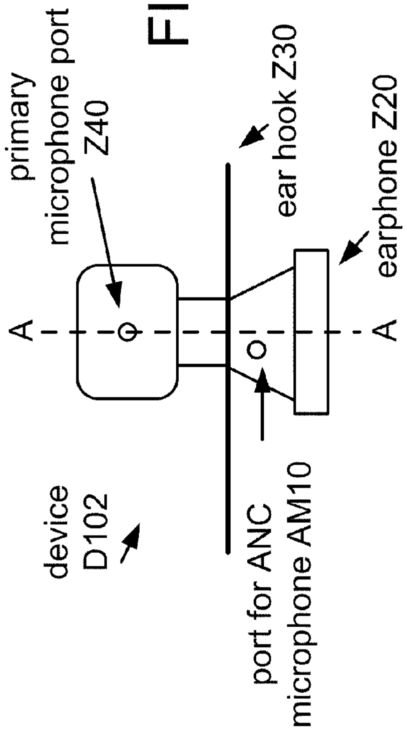
Figure 8C:
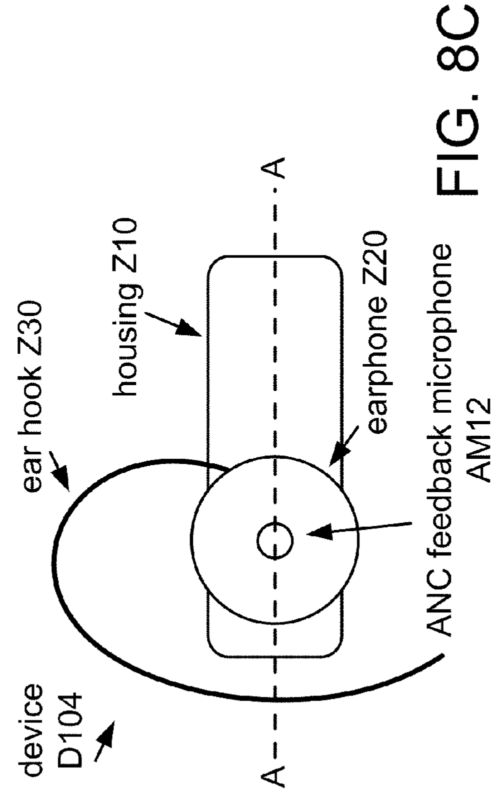
FIG. 8C shows a view of an implementation D104 of device D100.
Figures 9A, 9B, 9C, 9D:
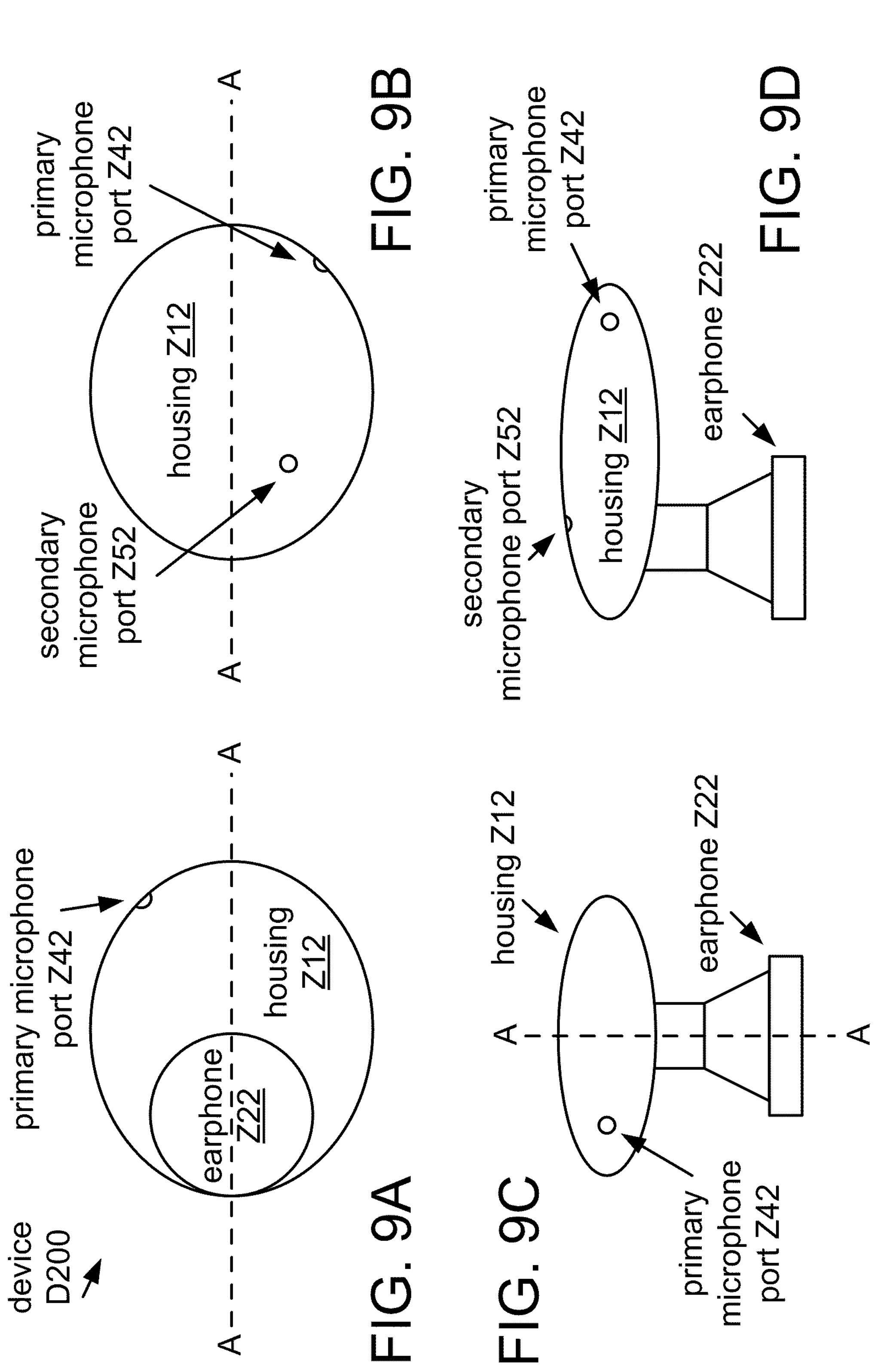
FIGS. 9A to 9D show various views of a multi-microphone portable audio sensing device D200.

FIGS. 8A and 8B show various views of an implementation D102 of headset D100 that includes at least one additional microphone AM10 to produce sensed noise reference signal SS10. FIG. 8C shows a view of an implementation D104 of headset D100 that includes a feedback implementation AM12 of microphone AM10 that is directed at the user's ear (e.g., down the user's ear canal) to produce sensed noise reference signal SS10.

A headset may include a securing device, such as ear hook Z30, which is typically detachable from the headset. An external ear hook may be reversible, for example, to allow the user to configure the headset for use on either ear. Alternatively or additionally, the earphone of a headset may be designed as an internal securing device (e.g., an earplug) which may include a removable earpiece to allow different users to use an earpiece of different size (e.g., diameter) for better fit to the outer portion of the particular user's ear canal. For a feedback ANC system, the earphone of a headset may also include a microphone arranged to pick up an acoustic error signal.

Figure 10A:
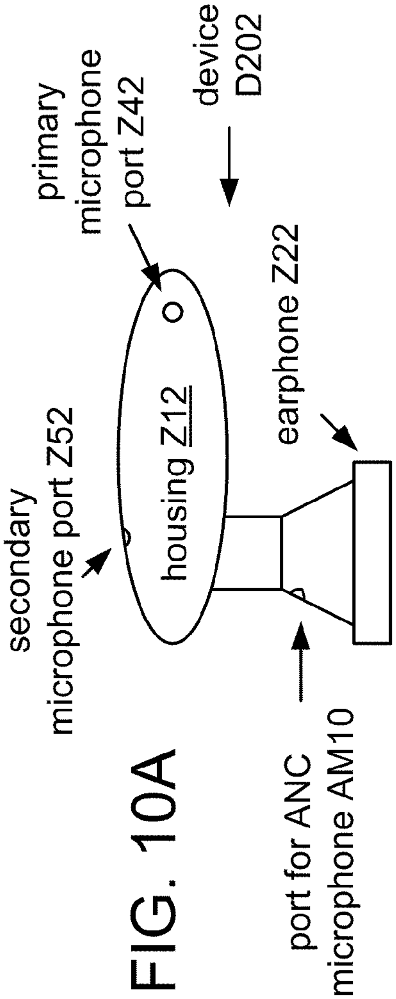
FIG. 10A shows a view of an implementation D202 of device D200.
Figure 10B:
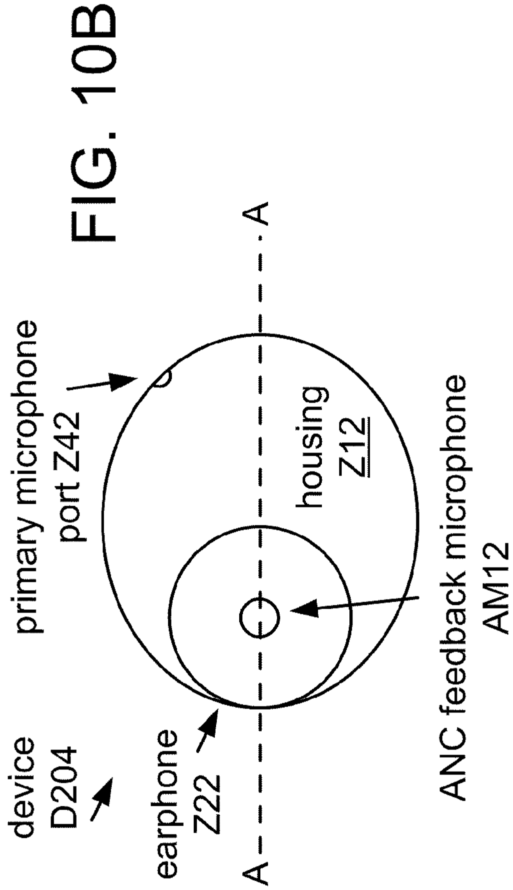
FIG. 10B shows a view of an implementation D204 of device D200.

FIGS. 9A to 9D show various views of a multi-microphone portable audio sensing device D200 that is another example of a wireless headset that may include an implementation of an ANC apparatus as described herein. Device D200 includes a rounded, elliptical housing Z12 and an earphone Z22 that includes loudspeaker SP10 and may be configured as an earplug. FIGS. 9A to 9D also show the locations of the acoustic port Z42 for the primary microphone and the acoustic port Z52 for the secondary microphone of multimicrophone array R100 of device D200. It is possible that secondary microphone port Z52 may be at least partially occluded (e.g., by a user interface button). FIGS. 10A and 10B show various views of an implementation D202 of headset D200 that includes at least one additional microphone AM10 to produce sensed noise reference signal SS10.

In a further example, a communications handset (e.g., a cellular telephone handset) that includes the processing elements of an implementation of an adaptive ANC apparatus as described herein (e.g., apparatus A100) is configured to receive sensed noise reference signal SS10 and sensed multichannel signal SS20 from a headset that includes array R100 and ANC microphone AM10, and to output audio output signal SO10 to the headset over a wired and/or wireless communications link (e.g., using a version of the Bluetooth™ protocol).

It may be desirable, in a communications application, to mix the sound of the user's own voice into the received signal that is played at the user's ear. The technique of mixing a microphone input signal into a loudspeaker output in a voice communications device, such as a headset or telephone, is called "sidetone." By permitting the user to hear her own voice, sidetone typically enhances user comfort and increases efficiency of the communication.

An ANC device is typically configured to provide good acoustic insulation between the user's ear and the external environment. For example, an ANC device may include an earbud that is inserted into the user's ear canal. When ANC operation is desired, such acoustic insulation is advantageous. At other times, however, such acoustic insulation may prevent the user from hearing desired environmental sounds, such as conversation from another person or warning signals, such as car horns, sirens, and other alert signals. Therefore, it may be desirable to configure apparatus A100 to provide an ANC operating mode, in which ANC filter F10 is configured to attenuate environmental sound; and a passthrough operating mode (also called a "hearing aid" or "sidetone" operating mode), in which ANC filter F10 is configured to pass, and possibly to equalize or enhance, one or more components of a sensed ambient sound signal.

Current ANC systems are controlled manually via an on/off switch. Because of changes in the acoustic environment and/or in the way that the user is using the ANC device, however, the operating mode that has been manually selected may no longer be appropriate. It may be desirable to implement apparatus A100 to include automatic control of the ANC operation. Such control may include detecting how the user is using the ANC device, and selecting an appropriate operating mode.

In one example, ANC filter F10 is configured to generate an antiphase signal in an ANC operating mode and to generate an in-phase signal in a passthrough operating mode. In another example, ANC filter F10 is configured to have a positive filter gain in an ANC operating mode and to have a negative filter gain in a passthrough operating mode. Switching between these two modes may be performed manually (e.g., via a button, touch sensor, capacitive proximity sensor, or ultrasonic gesture sensor) and/or automatically.

Figure 11A:
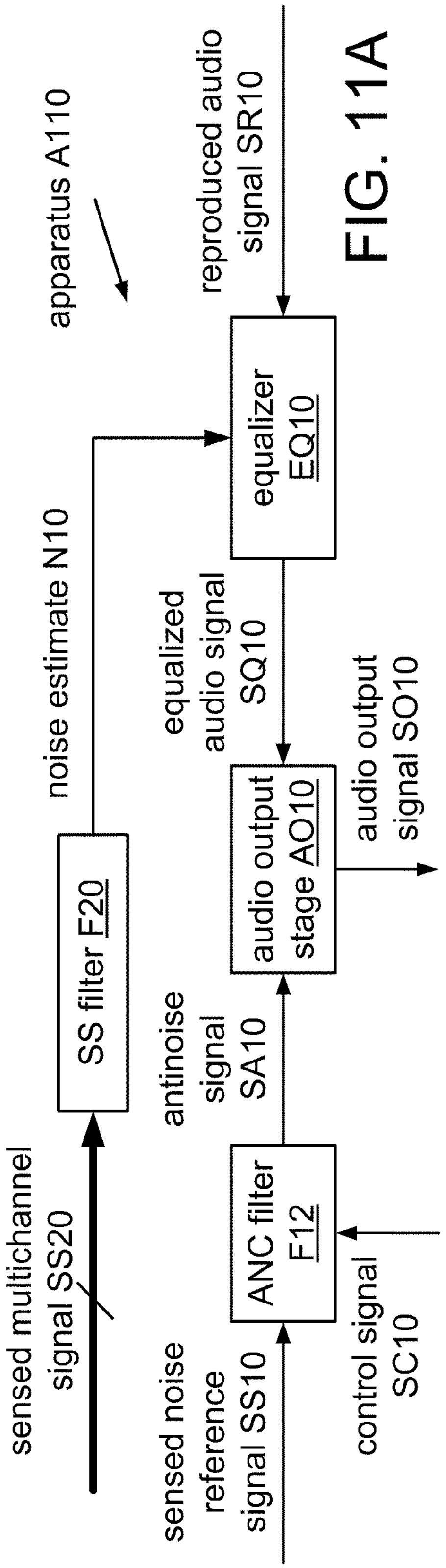
FIG. 11A shows a block diagram of an implementation A110 of apparatus A100.

FIG. 11A shows a block diagram of an implementation A110 of apparatus A100 that includes a controllable implementation F12 of ANC filter F10. ANC filter F10 is arranged to perform an ANC operation on sensed noise reference signal SS10, according to the state of a control signal SC10, to produce anti-noise signal SA10. The state of control signal SC10 may control one or more of an ANC filter gain, an ANC filter cutoff frequency, an activation state (e.g., on or off), or an operational mode of ANC filter F12. For example, apparatus A110 may be configured such that the state of control signal SC10 causes ANC filter F12 to switch between a first operational mode for actively cancelling ambient sound (also called an ANC mode) and a second operational mode for passing the ambient sound or for passing one or more selected components of the ambient sound, such as ambient speech (also called a passthrough mode).

Figure 11B:
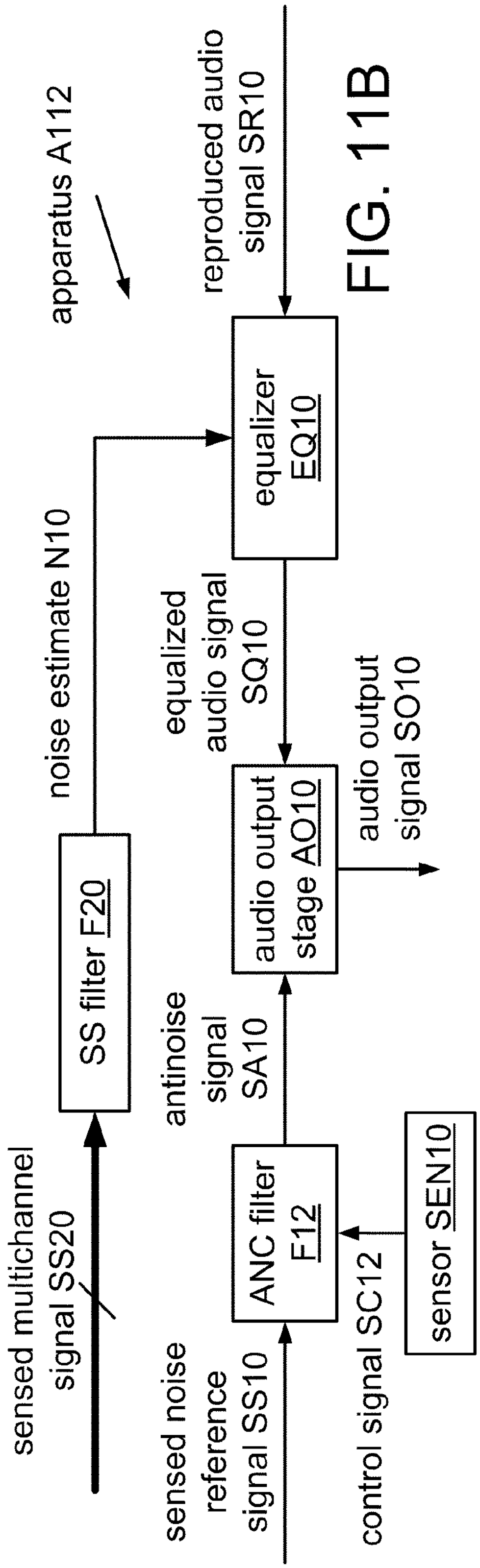
FIG. 11B shows a block diagram of an implementation A112 of apparatus A110.

ANC filter F12 may be arranged to receive control signal SC10 from actuation of a switch or touch sensor (e.g., a capacitive touch sensor) or from another user interface. FIG. 11B shows a block diagram of an implementation A112 of apparatus A110 that includes a sensor SEN10 configured to generate an instance SC12 of control signal SC10. Sensor SEN10 may be configured to detect when a telephone call is dropped (or when the user hangs up) and to deactivate ANC filter F12 (i.e., via control signal SC12) in response to such detection. Such a sensor may also be configured to detect when a telephone call is received or initiated by the user and to activate ANC filter F12 in response to such detection. Alternatively or additionally, sensor SEN10 may include a proximity detector (e.g., a capacitive or ultrasonic sensor) that is arranged to detect whether the device is currently in or close to the user's ear and to activate (or deactivate) ANC filter F12 accordingly. Alternatively or additionally, sensor SEN10 may include a gesture sensor (e.g., an ultrasonic gesture sensor) that is arranged to detect a command gesture by the user and to activate or deactivate ANC filter F12 accordingly. Apparatus A110 may also be implemented such that ANC filter F12 switches between a first operational mode (e.g., an ANC mode) and a second operational mode (e.g., a passthrough mode) in response to the output of sensor SEN10.

ANC filter F12 may be configured to perform additional processing of sensed noise reference signal SS10 in a passthrough operating mode. For example, ANC filter F12 may be configured to perform a frequency-selective processing operation (e.g., to amplify selected frequencies of sensed noise reference signal SS10, such as frequencies above 500 Hz or another high-frequency range). Alternatively or additionally, for a case in which sensed noise reference signal SS10 is a multichannel signal, ANC filter F12 may be configured to perform a directionally selective processing operation (e.g., to attenuate sound from the direction of the user's mouth) and/or a proximity-selective processing operation (e.g., to amplify far-field sound and/or to suppress near-field sound, such as the user's own voice). A proximity-selective processing operation may be performed, for example, by comparing the relative levels of the channels at different times and/or in different frequency bands. In such case, different channel levels tends to indicate a near-field signal, while similar channel levels tends to indicate a far-field signal.

Figure 12A:
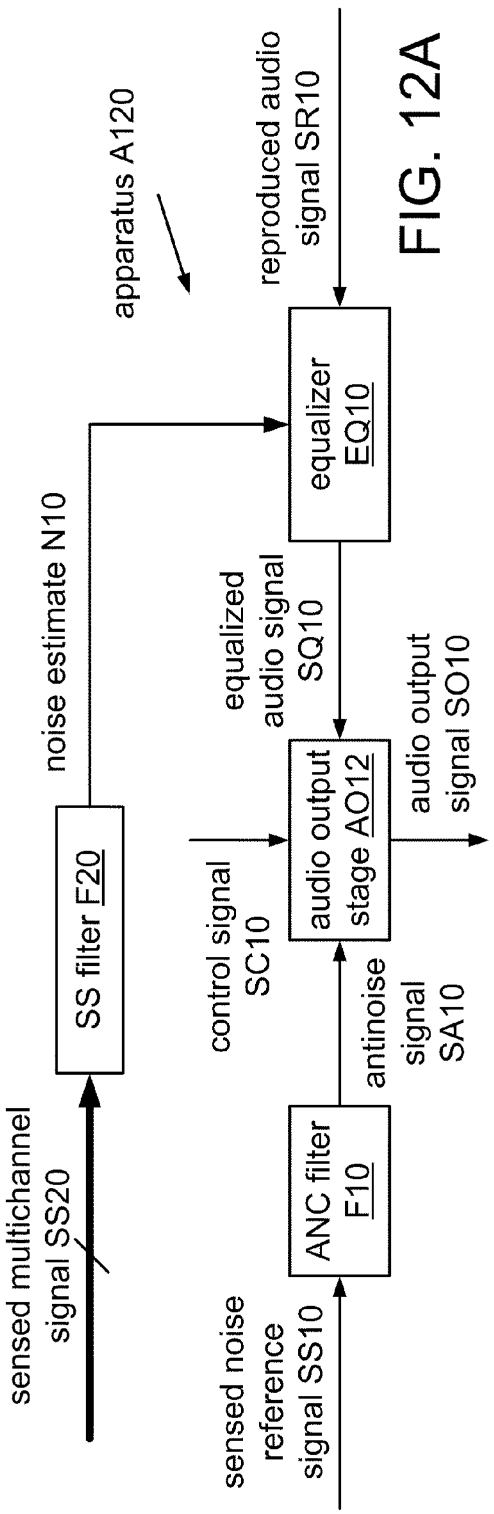
FIG. 12A shows a block diagram of an implementation A120 of apparatus A100.

As described above, the state of control signal SC10 may be used to control an operation of ANC filter F10. For example, apparatus A110 may be configured to use control signal SC10 to vary a level of anti-noise signal SA10 in audio output signal SO10 by controlling a gain of ANC filter F12. Alternatively or additionally, it may be desirable to use the state of control signal SC10 to control an operation of audio output stage AO10. FIG. 12A shows a block diagram of such an implementation A120 of apparatus A100 that includes a controllable implementation AO12 of audio output stage AO10.

Figure 12B:
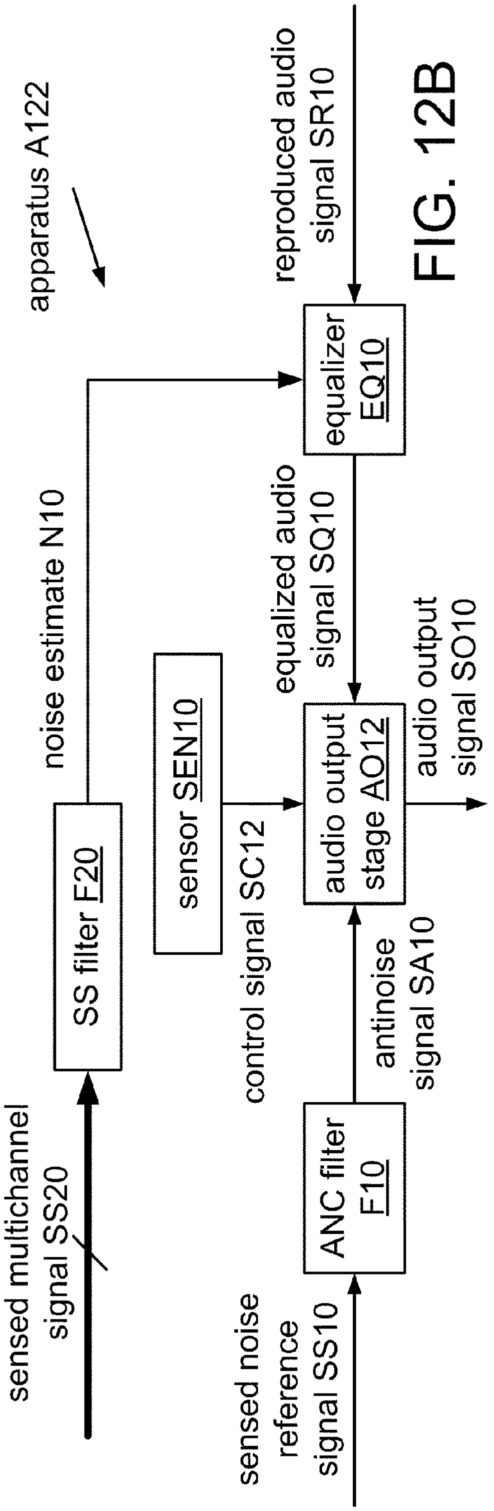
FIG. 12B shows a block diagram of an implementation A122 of apparatus A120.

Audio output stage AO12 is configured to produce audio output signal SO10 according to a state of control signal SC10. It may be desirable, for example, to configure stage AO12 to produce audio output signal SO10 by varying a level of anti-noise signal SA10 in audio output signal SO10 (e.g., to effectively control a gain of the ANC operation) according to a state of control signal SC10. In one example, audio output stage AO12 is configured to mix a high (e.g., maximum) level of anti-noise signal SA10 with equalized signal SQ10 when control signal SC10 indicates an ANC mode, and to mix a low (e.g., minimum or zero) level of anti-noise signal SA10 with equalized audio signal SQ10 when control signal SC10 indicates a passthrough mode. In another example, audio output stage AO12 is configured to mix a high level of anti-noise signal SA10 with a low level of equalized signal SQ10 when control signal SC10 indicates an ANC mode, and to mix a low level of anti-noise signal SA10 with a high level of equalized audio signal SQ10 when control signal SC10 indicates a passthrough mode. FIG. 12B shows a block diagram of an implementation A122 of apparatus A120 that includes an instance of sensor SEN10 as described above which is configured to generate an instance SC12 of control signal SC10.

Figure 13A:
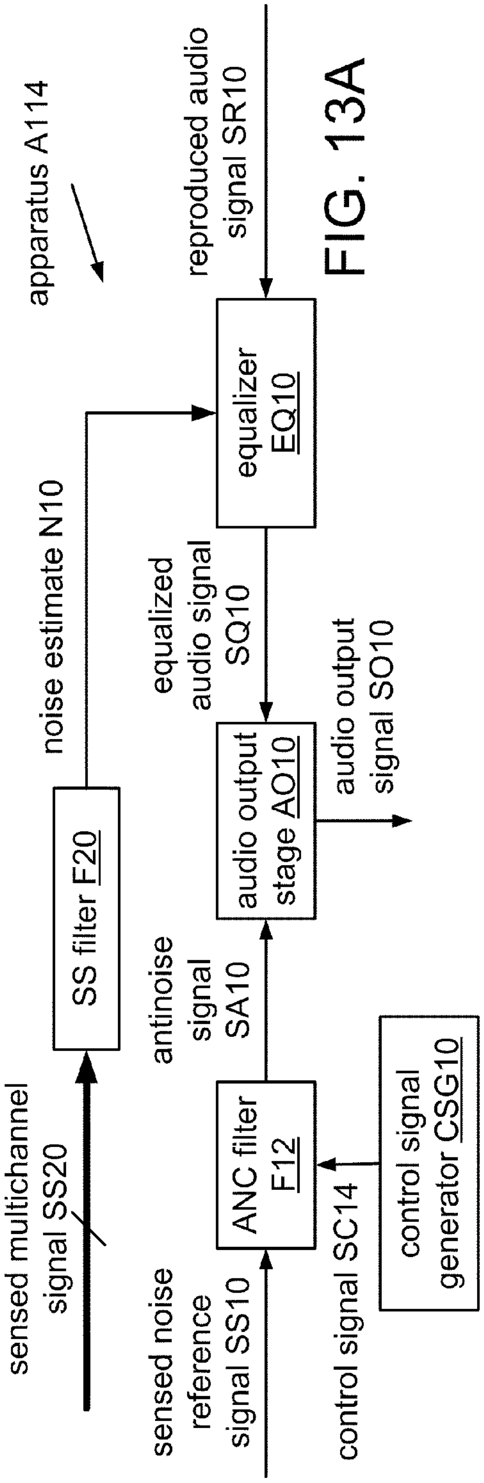
FIG. 13A shows a block diagram of an implementation A114 of apparatus A110.
Figure 13B:
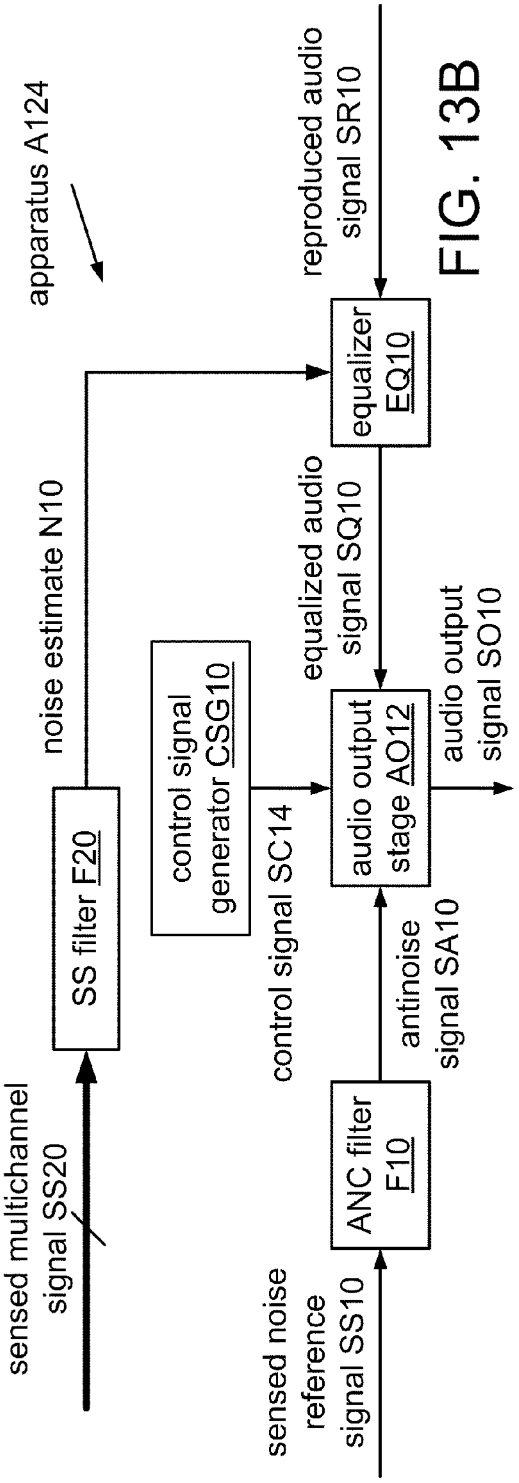
FIG. 13B shows a block diagram of an implementation A124 of apparatus A120.

Apparatus A100 may be configured to modify the ANC operation based on information from sensed multichannel signal SS20, noise estimate N10, reproduced audio signal SR10, and/or equalized audio signal SQ10. FIG. 13A shows a block diagram of an implementation A114 of apparatus A110 that includes ANC filter F12 and a control signal generator CSG10. Control signal generator CSG10 is configured to generate an instance SC14 of control signal SC10, based on information from at least one among sensed multichannel signal SS20, noise estimate N10, reproduced audio signal SR10, and equalized audio signal SQ10, that controls one or more aspects of the operation of ANC filter F12. For example, apparatus A114 may be implemented such that ANC filter F12 switches between a first operational mode (e.g., an ANC mode) and a second operational mode (e.g., a passthrough mode) in response to the state of signal SC14. FIG. 13B shows a block diagram of a similar implementation A124 of apparatus A120 in which control signal SC14 controls one or more aspects of the operation of audio output stage AO12 (e.g., a level of anti-noise signal SA10 and/or of equalized signal SQ10 in audio output signal SO10).

It may be desirable to configure apparatus A110 such that ANC filter F12 remains inactive when no reproduced audio signal SR10 is available. Alternatively, ANC filter F12 may be configured to operate in a desired operating mode during such periods, such as a passthrough mode. The particular mode of operation during periods when reproduced audio signal SR10 is not available may be selected by the user (for example, as an option in a configuration of the device).

When reproduced audio signal SR10 becomes available, it may be desirable for control signal SC10 to provide a maximum degree of noise cancellation (e.g., to allow the user to hear the far-end audio better). For example, it may be desirable for control signal SC10 to control ANC filter F12 to have a high gain, such as a maximum gain. Alternatively or additionally, it may be desirable in such case to control audio output stage AO12 to mix a high level of anti-noise signal SA10 with equalized audio signal SQ10.

It may also be desirable for control signal SC10 to provide a lesser degree of active noise cancellation when far-end activity ceases (e.g., to control audio output stage AO12 to mix a lower level of anti-noise signal SA10 with equalized audio signal SQ10 and/or to control ANC filter F12 to have a lower gain). In such case, it may be desirable to implement a hysteresis or other temporal smoothing mechanism between such states of control signal SC10 (e.g., to avoid or reduce annoying in/out artifacts due to speech transients in the far-end audio signal, such as pauses between words or sentences).

Control signal generator CSG10 may be configured to map values of one or more qualities of sensed multichannel signal SS20 and/or of noise estimate N10 to corresponding states of control signal SC14. For example, control signal generator CSG10 may be configured to generate control signal SC14 based on a level (e.g., an energy) of sensed multichannel signal SS20 or of noise estimate N10, which level may be smoothed over time. In such a case, control signal SC14 may control ANC filter F12 and/or audio output stage AO12 to provide a lesser degree of active noise cancellation when the level is low.

Other examples of qualities of sensed multichannel signal SS20 and/or of noise estimate N10 that may be mapped by control signal generator CSG10 to corresponding states of control signal SC14 include a level over each of one or more frequency subbands. For example, control signal generator CSG10 may be configured to calculate a level of sensed multichannel signal SS20 or noise estimate N10 over a low-frequency band (e.g., frequencies below 200 Hz, or below 500 Hz). Control signal generator CSG10 may be configured to calculate a level over a band of a frequency-domain signal by summing the magnitudes (or the squared magnitudes) of the frequency components in the desired band. Alternatively, control signal generator CSG10 may be configured to calculate a level over a frequency band of a time-domain signal by filtering the signal to obtain a subband signal and calculating the level (e.g., the energy) of the subband signal. It may be desirable to use a biquad filter to perform such time-domain filtering efficiently. In such cases, control signal SC14 may control ANC filter F12 and/or audio output stage AO12 to provide a lesser degree of active noise cancellation when the level is low.

Figure 14A:
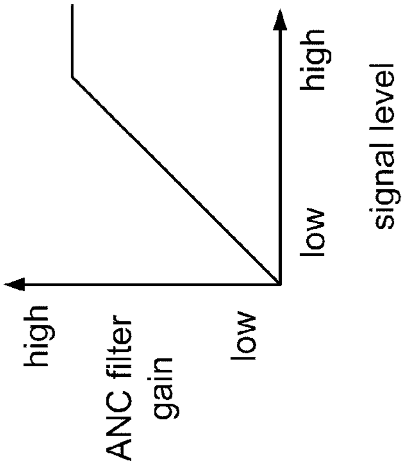
FIGS. 14A-14C show examples of different profiles for mapping noise level values to ANC filter gain values.
Figure 14B:
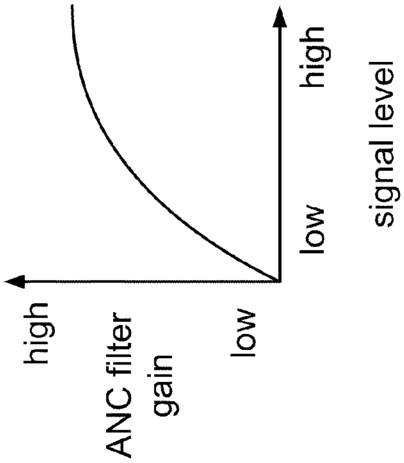
Figure 14C:
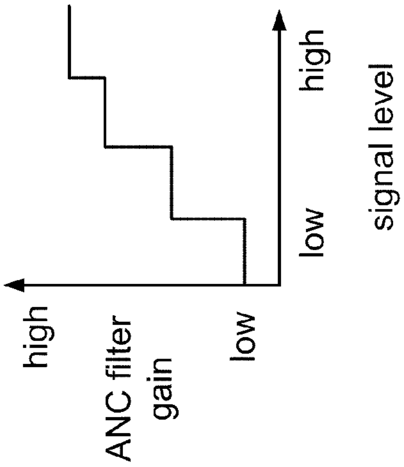

It may be desirable to configure apparatus A114 to use control signal SC14 to control one or more parameters of ANC filter F12, such as a gain of ANC filter F12, a cutoff frequency of ANC filter F12, and/or an operating mode of ANC filter F12. In such case, control signal generator CSG10 may be configured to map a signal quality value to a corresponding control parameter value according to a mapping that may be linear or nonlinear, and continuous or discontinuous. FIGS. 14A-14C show examples of different profiles for mapping values of a level of sensed multichannel signal SS20 or noise estimate N10 (or of a subband of such a signal) to ANC filter gain values. FIG. 14A shows a bounded example of a linear mapping, FIG. 14B shows an example of a nonlinear mapping, and FIG. 14C shows an example of mapping a range of level values to a finite set of gain states. In one particular example, control signal generator CSG10 maps levels of noise estimate N10 up to 60 dB to a first ANC filter gain state, levels from 60 to 70 dB to a second ANC filter gain state, levels from 70 to 80 dB to a third ANC filter gain state, and levels from 80 to 90 dB to a fourth ANC filter gain state.

Figure 14D:
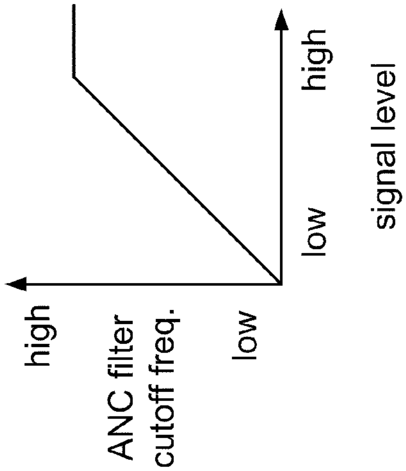
FIGS. 14D-14F show examples of different profiles for mapping noise level values to ANC filter cutoff frequency values.
Figure 14E:
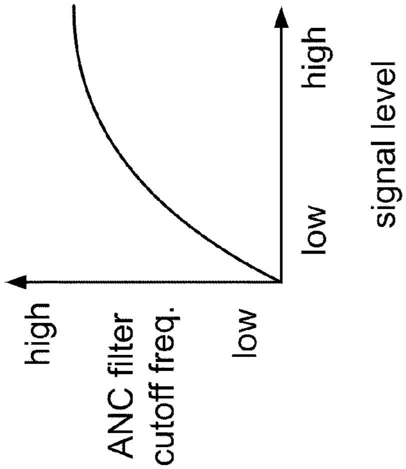
Figure 14F:
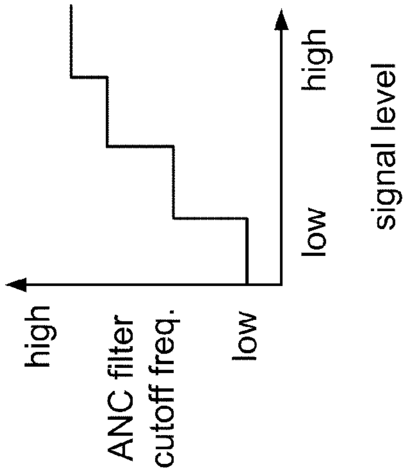

FIGS. 14D-14F show examples of similar profiles that may be used by control signal generator CSG10 to map signal (or subband) level values to ANC filter cutoff frequency values. At a low cutoff frequency, an ANC filter is typically more efficient. While average efficiency of an ANC filter may be reduced at a high cutoff frequency, the effective bandwidth is extended. One example of a maximum cutoff frequency for ANC filter F12 is two kilohertz.

Control signal generator CSG10 may be configured to generate control signal SC14 based on a frequency distribution of sensed multichannel signal SS20. For example, control signal generator CSG10 may be configured to generate control signal SC14 based on a relation between levels of different subbands of sensed multichannel signal SS20 (e.g., a ratio between an energy of a high-frequency subband and an energy of a low-frequency subband). A high value of such a ratio indicates the presence of speech activity. In one example, control signal generator CSG10 is configured to map a high value of the ratio of high-frequency energy to low-frequency energy to the passthrough operating mode, and to map a low ratio value to the ANC operating mode. In another example, control signal generator CSG10 maps the ratio values to values of ANC filter cutoff frequency. In this case, control signal generator CSG10 may be configured to map high ratio values to low cutoff frequency values, and to map low ratio values to high cutoff frequency values.

Alternatively or additionally, control signal generator CSG10 may be configured to generate control signal SC14 based on a result of one or more other speech activity detection (e.g., voice activity detection) operations, such as pitch and/or formant detection. For example, control signal generator CSG10 may be configured to detect speech (e.g., to detect spectral tilt, harmonicity, and/or formant structure) in sensed multichannel signal SS20 and to select the passthrough operating mode in response to such detection. In another example, control signal generator CSG10 is configured to select a low cutoff frequency for ANC filter F12 in response to speech activity detection, and to select a high cutoff frequency value otherwise.

It may be desirable to smooth transitions between states of ANC filter F12 over time. For example, it may be desirable to configure control signal generator CSG10 to smooth the values of each of one or more signal qualities and/or control parameters over time (e.g., according to a linear or nonlinear smoothing function). One example of a linear temporal smoothing function is $y=ap+(1-a)x$, where x is a present value, p is the most recent smoothed value, y is the current smoothed value, and a is a smoothing factor having a value in the range of from zero (no smoothing) to one (no updating).

Figure 15:
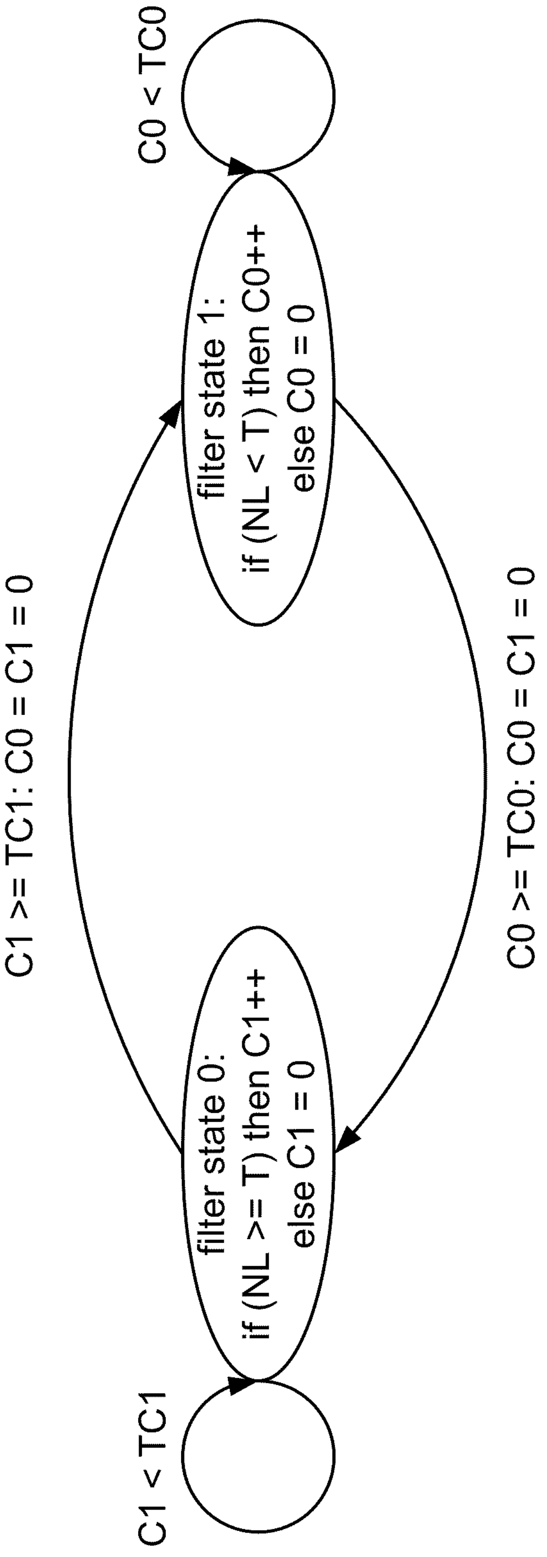
FIG. 15 shows an example of a hysteresis mechanism for a two-state ANC filter.

Alternatively or additionally, it may be desirable to use a hysteresis mechanism to inhibit transitions between states of ANC filter F12. Such a mechanism may be configured to transition from one filter state to another only after the transition condition has been satisfied for a given number of consecutive frames. FIG. 15 shows one example of such a mechanism for a two-state ANC filter. In filter state 0 (e.g., ANC filtering is disabled), the level NL of noise estimate N10 is evaluated at each frame. If the transition condition is satisfied (i.e., if NL is at least equal to a threshold value T), then a count value C1 is incremented, and otherwise C1 is cleared. Transition to filter state 1 (e.g., ANC filtering is enabled) occurs only when the value of C1 reaches a threshold value TC1. Similarly, transition from filter state 1 to filter state 0 occurs only when the number of consecutive frames in which NL has been less than T exceeds a threshold value TC0. Similar hysteresis mechanisms may be applied to control transitions between more than two filter states (e.g., as shown in FIGS. 14C and 14F).

It may be desirable to avoid active cancellation of some ambient signals. For example, it may be desirable to avoid active cancellation of one or more of the following: a near-end signal having a loudness above a threshold; a near-end signal containing speech formants; a near-end signal otherwise identified as speech; a near-end signal having characteristics of a warning signal, such as a siren, vehicle horn, or other emergency or alert signal (e.g., a particular spectral signature, or a spectrum in which the energy is concentrated in one or only a few narrow bands).

When such a signal is detected in the user's environment (e.g., within sensed multichannel signal SS20), it may be desirable for control signal SC10 to cause the ANC operation to pass the signal. For example, it may be desirable for control signal SC14 to control audio output stage AO12 to attenuate, block, or even invert anti-noise signal SA10 (alternatively, to control ANC filter F12 to have a low gain, a zero gain, or even a negative gain). In one example, control signal generator CSG10 is configured to detect warning sounds (e.g., tonal components, or components that have narrow bandwidths in comparison to other sound signals, such as noise components) in sensed multichannel signal SS20 and to select a passthrough operating mode in response to such detection.

During periods when far-end audio is available, it may be desirable in most cases for audio output stage AO10 to mix a high amount (e.g., a maximum amount) of equalized audio signal SQ10 with anti-noise signal SA10 throughout the period. However, it may be desirable in some cases to override such operation temporarily according to an external event, such as the presence of a warning signal or of near-end speech.

It may be desirable to control the operation of equalizer EQ10 according to the frequency content of sensed multichannel signal SS20. For example, it may be desirable to disable modification of reproduced audio signal SR10 (e.g., according to a state of control signal SC10 or a similar control signal) during the presence of a warning signal or of near-end speech. It may be desirable to disable any such modification, unless reproduced audio signal SR10 is active while the near-end signal is not. In the case of "double talk" where near-end speech and reproduced audio signal SR10 are both active, it may be desirable for control signal SC14 to control audio output stage AO12 to mix equalized signal SQ10 and anti-noise signal SA10 at appropriate percentages (such as simply 50-50, or in proportion to relative signal strength).

It may be desirable to configure control signal generator CSG10, and/or to configure the effect of control signal SC10 on ANC filter F12 or audio output stage AO12, according to a user preference for the device (e.g., through a user interface to the device). This configuration may indicate, for example, whether the active cancellation of ambient noise should be interrupted in the presence of external signals, and what kind of signals should trigger such interruption. For instance, a user can select not to be interrupted by close talkers, but still to be notified of emergency signals. Alternatively, the user may choose to amplify near-end speakers at a different rate than emergency signals.

Figure 17:
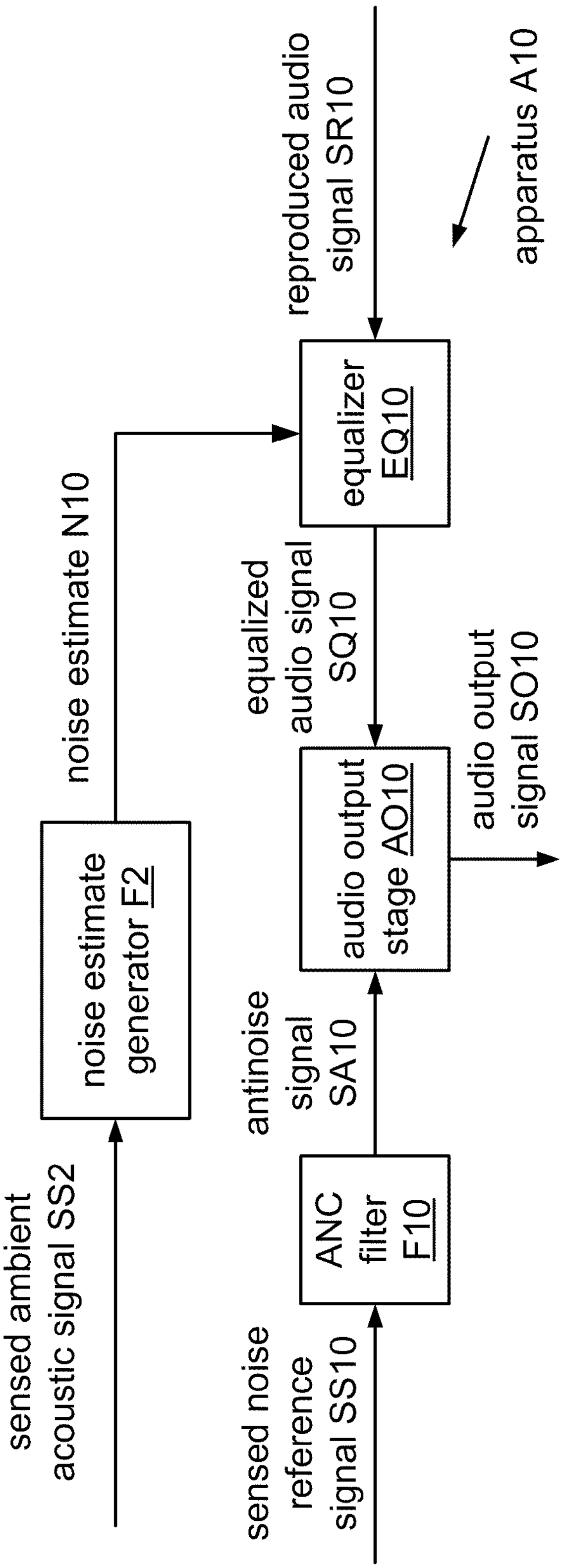
FIG. 17 is a block diagram of an apparatus A10 according to a general configuration.

Apparatus A100 is a particular implementation of a more general configuration A10. FIG. 17 shows a block diagram of apparatus A10, which includes a noise estimate generator F2 that is configured to generate noise estimate N10 based on information from a sensed ambient acoustic signal SS2. Signal SS may be a single-channel signal (e.g., based on a signal from a single microphone). Noise estimate generator F2 is a more general configuration of spatially selective filter F20. Noise estimate generator F2 may be configured to perform a temporal selection operation on sensed ambient acoustic signal SS2 (e.g., using a voice activity detection (VAD) operation, such as any one or more of the speech activity operations described herein) such that noise estimate N10 is updated only for frames that lack voice activity. For example, noise estimate generator F2 may be configured to calculate noise estimate N10 as an average over time of inactive frames of sensed ambient acoustic signal SS2. It is noted that while spatially selective filter F20 may be configured to produce a noise estimate N10 that includes nonstationary noise components, a time average of inactive frames is likely to include only stationary noise components.

Figure 18:
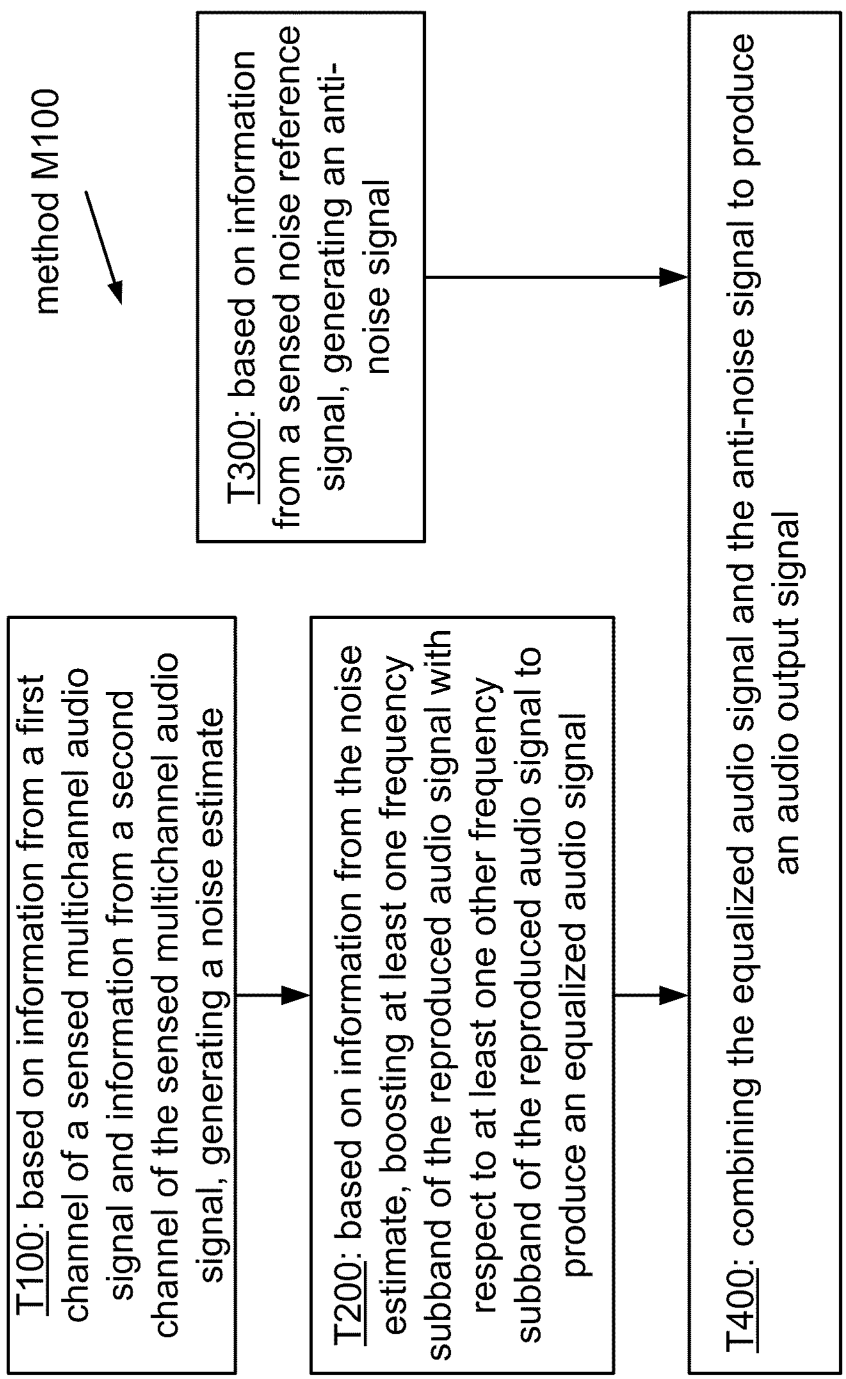
FIG. 18 shows a flowchart of a method M100 according to a general configuration.

FIG. 18 shows a flowchart of a method M100 according to a general configuration that includes tasks T100, T200, T300, and T400. Method M100 may be performed within a device that is configured to process audio signals, such as any of the ANC devices described herein. Task T100 generates a noise estimate based on information from a first channel of a sensed multichannel audio signal and information from a second channel of the sensed multichannel audio signal (e.g., as described herein with reference to spatially selective filter F20). Task T200 boosts at least one frequency subband of a reproduced audio signal with respect to at least one other frequency subband of the reproduced audio signal, based on information from the noise estimate, to produce an equalized audio signal (e.g., as described herein with reference to equalizer EQ10). Task T300 generates an anti-noise signal based on information from a sensed noise reference signal (e.g., as described herein with reference to ANC filter F10). Task T400 combines the equalized audio signal and the anti-noise signal to produce an audio output signal (e.g., as described herein with reference to audio output stage AO10).

Figure 19A:
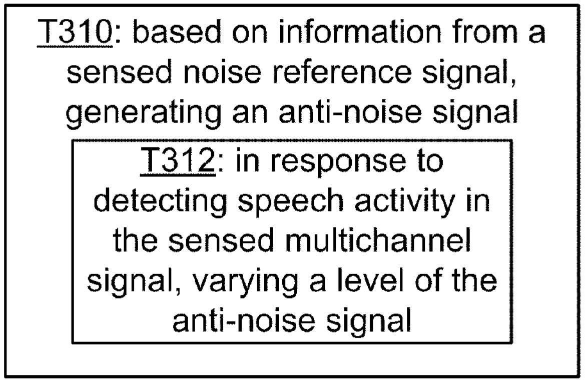
FIG. 19A shows a flowchart of an implementation T310 of task T300.

FIG. 19A shows a flowchart of an implementation T310 of task T300. Task T310 includes a subtask T312 that varies a level of the anti-noise signal in the audio output signal in response to a detection of speech activity in the sensed multichannel signal (e.g., as described herein with reference to ANC filter F12).

Figure 19B:
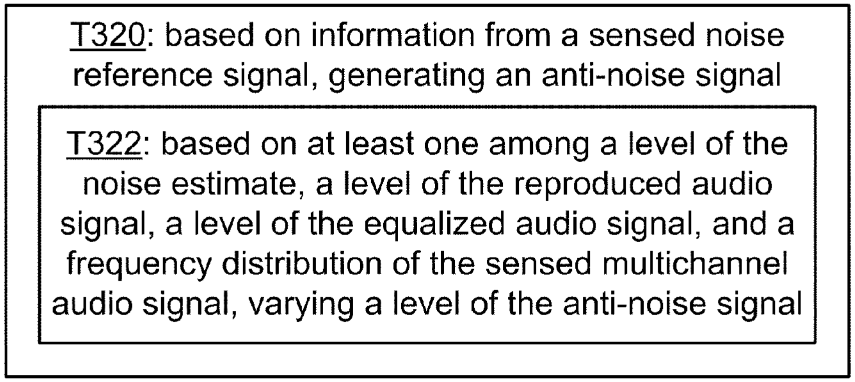
FIG. 19B shows a flowchart of an implementation T320 of task T300.

FIG. 19B shows a flowchart of an implementation T320 of task T300. Task T320 includes a subtask T322 that varies a level of the anti-noise signal in the audio output signal based on at least one among a level of the noise estimate, a level of the reproduced audio signal, a level of the equalized audio signal, and a frequency distribution of the sensed multichannel audio signal (e.g., as described herein with reference to ANC filter F12).

Figure 19C:
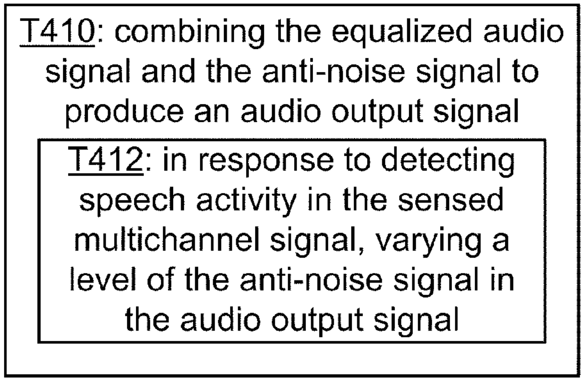
FIG. 19C shows a flowchart of an implementation T410 of task T400.

FIG. 19C shows a flowchart of an implementation T410 of task T400. Task T410 includes a subtask T412 that varies a level of the anti-noise signal in the audio output signal in response to a detection of speech activity in the sensed multichannel signal (e.g., as described herein with reference to audio output stage AO12).

Figure 19D:
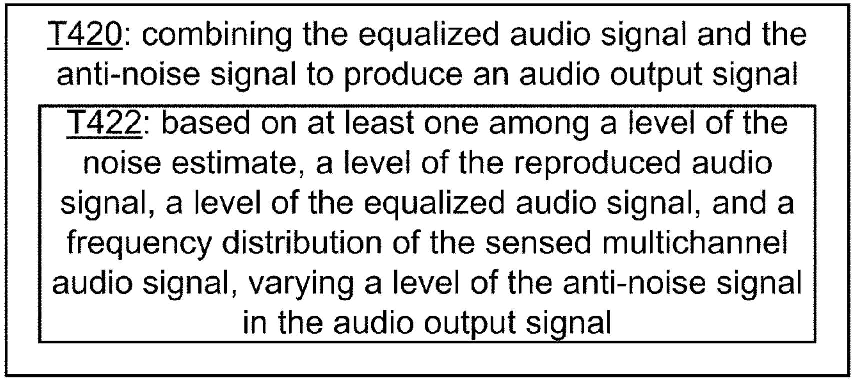
FIG. 19D shows a flowchart of an implementation T420 of task T400.

FIG. 19D shows a flowchart of an implementation T420 of task T400. Task T420 includes a subtask T422 that varies a level of the anti-noise signal in the audio output signal based on at least one among a level of the noise estimate, a level of the reproduced audio signal, a level of the equalized audio signal, and a frequency distribution of the sensed multichannel audio signal (e.g., as described herein with reference to audio output stage AO12).

Figure 20B:
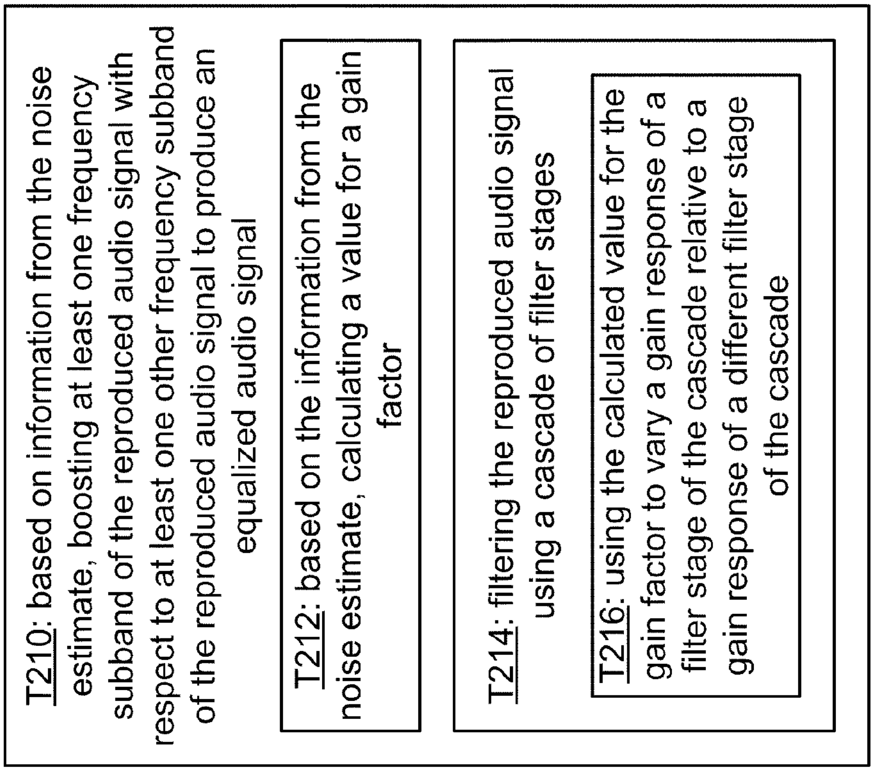
FIG. 20B shows a flowchart of an implementation T210 of task T200.
Figure 20A:
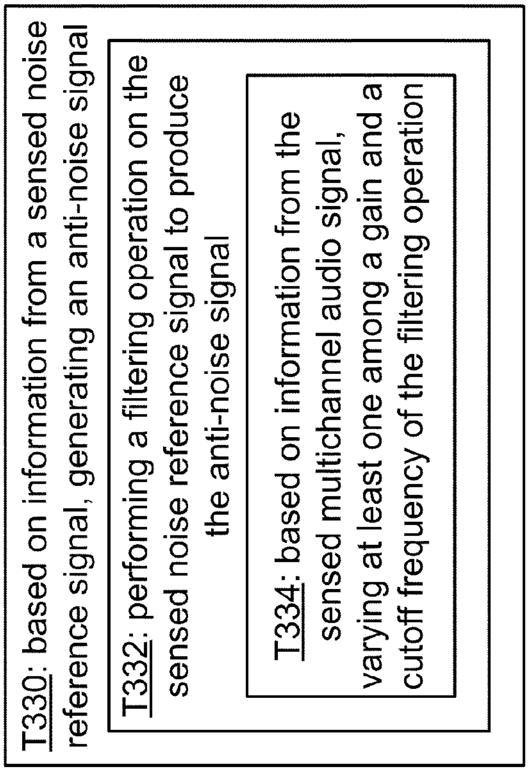
FIG. 20A shows a flowchart of an implementation T330 of task T300.

FIG. 20A shows a flowchart of an implementation T330 of task T300. Task T330 includes a subtask T332 that performs a filtering operation on the sensed noise reference signal to produce the anti-noise signal, and task T332 includes a subtask T334 that varies at least one among a gain and a cutoff frequency of the filtering operation, based on information from the sensed multichannel audio signal (e.g., as described herein with reference to ANC filter F12).

FIG. 20B shows a flowchart of an implementation T210 of task T200. Task T210 includes a subtask T212 that calculates a value for a gain factor based on information from the noise estimate. Task T210 also includes a subtask T214 that filters the reproduced audio signal using a cascade of filter stages, and task T214 includes a subtask T216 that uses the calculated value for the gain factor to vary a gain response of a filter stage of the cascade relative to a gain response of a different filter stage of the cascade (e.g., as described herein with reference to equalizer EQ10).

Figure 21:
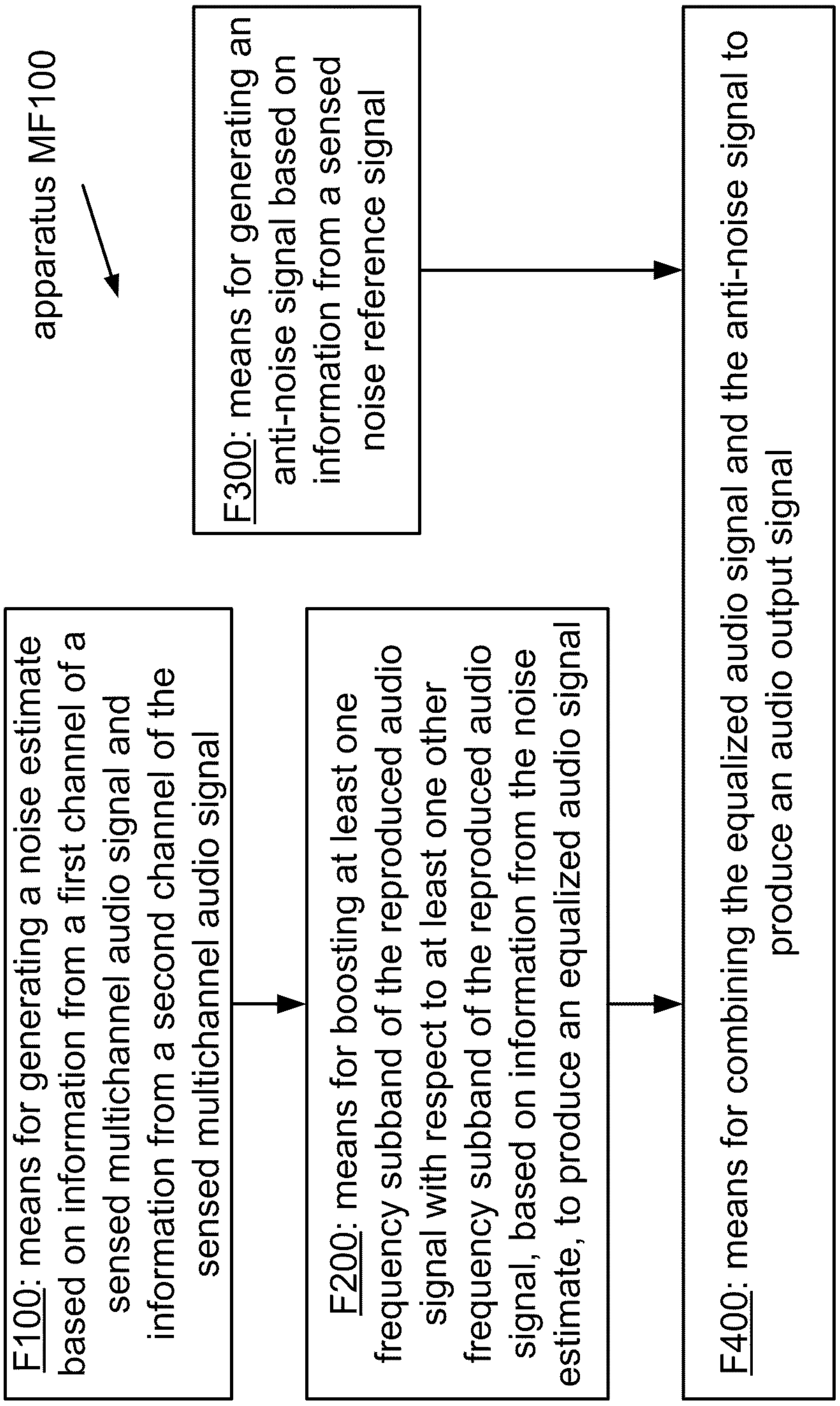
FIG. 21 shows a flowchart of an apparatus MF100 according to a general configuration.

FIG. 21 shows a flowchart of an apparatus MF100 according to a general configuration that may be included within a device that is configured to process audio signals, such as any of the ANC devices described herein. Apparatus MF100 includes means F100 for generating a noise estimate based on information from a first channel of a sensed multichannel audio signal and information from a second channel of the sensed multichannel audio signal (e.g., as described herein with reference to spatially selective filter F20 and task T100). Apparatus MF100 also includes means F200 for boosting at least one frequency subband of a reproduced audio signal with respect to at least one other frequency subband of the reproduced audio signal, based on information from the noise estimate, to produce an equalized audio signal (e.g., as described herein with reference to equalizer EQ10 and task T200). Apparatus MF100 also includes means F300 for generating an anti-noise signal based on information from a sensed noise reference signal (e.g., as described herein with reference to ANC filter F10 and task T300). Apparatus MF100 also includes means F400 for combining the equalized audio signal and the anti-noise signal to produce an audio output signal (e.g., as described herein with reference to audio output stage AO10 and task T400).

Figure 27:
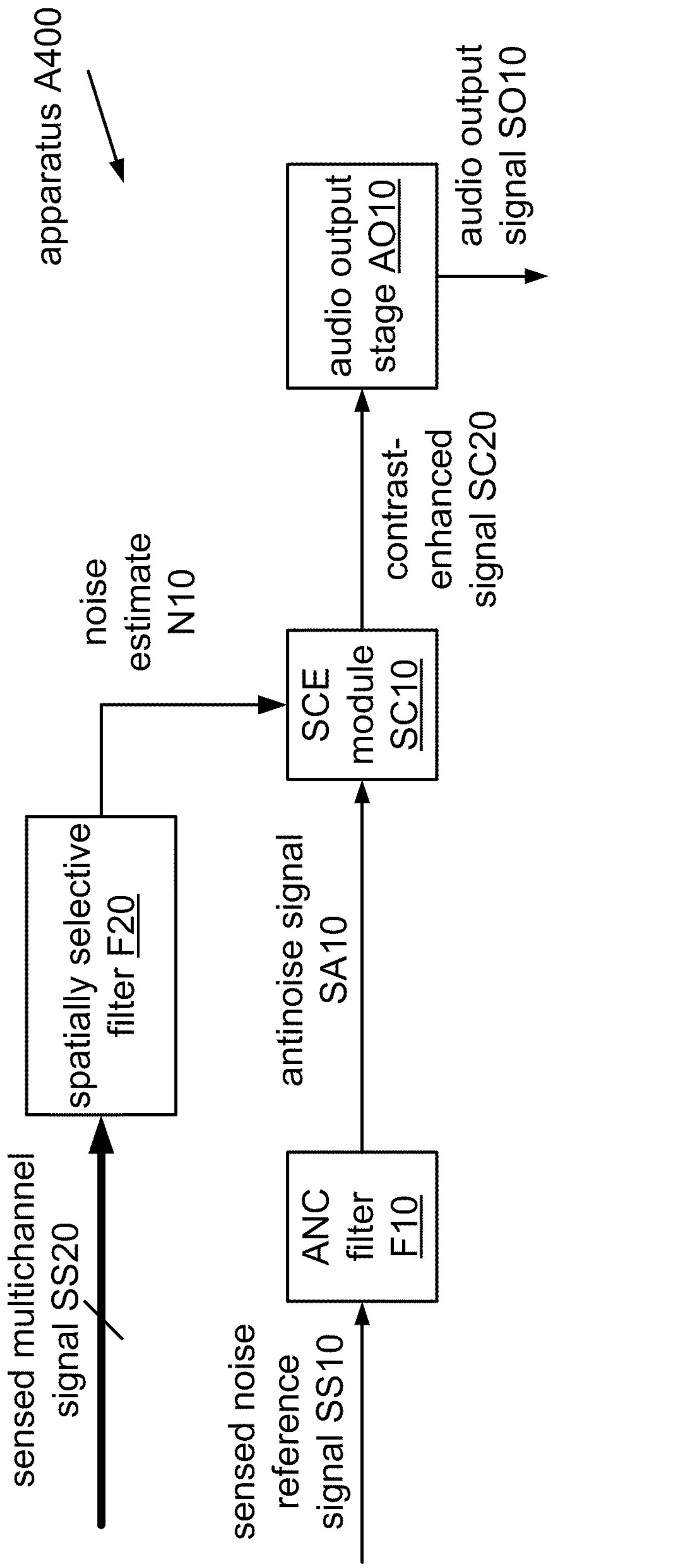
FIG. 27 shows a block diagram of an apparatus A400 according to a general configuration.
Figure 28:
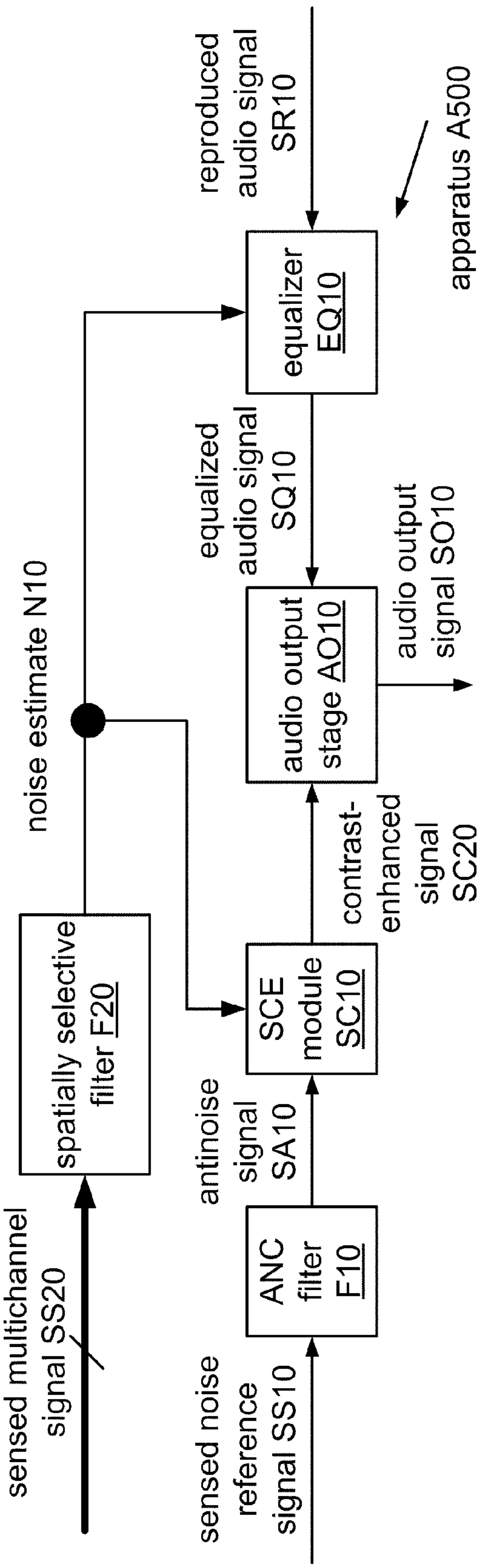
FIG. 28 shows a block diagram of an implementation A500 of both of apparatus A100 and apparatus A400.

FIG. 27 shows a block diagram of an apparatus A400 according to another general configuration. Apparatus A400 includes a spectral contrast enhancement (SCE) module SC10 that is configured to modify the spectrum of anti-noise signal AN10 based on information from noise estimate N10 to produce a contrast-enhanced signal SC20. SCE module SC10 may be configured to calculate an enhancement vector that describes a contrast-enhanced version of the spectrum of anti-noise signal SA10, and produce signal SC20 by boosting and/or attenuating subbands of anti-noise signal AN10, as indicated by corresponding values of the enhancement vector, to enhance the spectral contrast of speech content of anti-noise signal AN10 at subbands in which the power of noise estimate N10 is high. Further examples of implementation and operation of SCE module SC10 may be found, for example, in the description of enhancer EN10 in US Publ. Pat. Appl. No. 2009/0299742, published Dec. 3, 2009, entitled “SYSTEMS, METHODS, APPARATUS, AND COMPUTER PROGRAM PRODUCTS FOR SPECTRAL CONTRAST ENHANCEMENT.” FIG. 28 shows a block diagram of an apparatus A500 that is an implementation of both of apparatus A100 and apparatus A400.

The methods and apparatus disclosed herein may be applied generally in any transceiving and/or audio sensing application, especially mobile or otherwise portable instances of such applications. For example, the range of configurations disclosed herein includes communications devices that reside in a wireless telephony communication system configured to employ a code-division multiple-access (CDMA) over-the-air interface. Nevertheless, it would be understood by those skilled in the art that a method and apparatus having features as described herein may reside in any of the various communication systems employing a wide range of technologies known to those of skill in the art, such as systems employing Voice over IP (VoIP) over wired and/or wireless (e.g., CDMA, TDMA, FDMA, and/or TD-SCDMA) transmission channels.

It is expressly contemplated and hereby disclosed that communications devices disclosed herein may be adapted for use in networks that are packet-switched (for example, wired and/or wireless networks arranged to carry audio transmissions according to protocols such as VoIP) and/or circuit-switched. It is also expressly contemplated and hereby disclosed that communications devices disclosed herein may be adapted for use in narrowband coding systems (e.g., systems that encode an audio frequency range of about four or five kilohertz) and/or for use in wideband coding systems (e.g., systems that encode audio frequencies greater than five kilohertz), including whole-band wideband coding systems and split-band wideband coding systems.

The foregoing presentation of the described configurations is provided to enable any person skilled in the art to make or use the methods and other structures disclosed herein. The flowcharts, block diagrams, and other structures shown and described herein are examples only, and other variants of these structures are also within the scope of the disclosure. Various modifications to these configurations are possible, and the generic principles presented herein may be applied to other configurations as well. Thus, the present disclosure is not intended to be limited to the configurations shown above but rather is to be accorded the widest scope consistent with the principles and novel features disclosed in any fashion herein, including in the attached claims as filed, which form a part of the original disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof.

Important design requirements for implementation of a configuration as disclosed herein may include minimizing processing delay and/or computational complexity (typically measured in millions of instructions per second or MIPS), especially for computation-intensive applications, such as playback of compressed audio or audiovisual information (e.g., a file or stream encoded according to a compression format, such as one of the examples identified herein) or applications for wideband communications (e.g., voice communications at sampling rates higher than eight kilohertz, such as 12, 16, or 44 kHz).

Goals of a multi-microphone processing system may include achieving ten to twelve dB in overall noise reduction, preserving voice level and color during movement of a desired speaker, obtaining a perception that the noise has been moved into the background instead of an aggressive noise removal, dereverberation of speech, and/or enabling the option of post-processing for more aggressive noise reduction.

The various elements of an implementation of an ANC apparatus as disclosed herein may be embodied in any combination of hardware, software, and/or firmware that is deemed suitable for the intended application. For example, such elements may be fabricated as electronic and/or optical devices residing, for example, on the same chip or among two or more chips in a chipset. One example of such a device is a fixed or programmable array of logic elements, such as transistors or logic gates, and any of these elements may be implemented as one or more such arrays. Any two or more, or even all, of these elements may be implemented within the same array or arrays. Such an array or arrays may be implemented within one or more chips (for example, within a chipset including two or more chips).

One or more elements of the various implementations of the ANC apparatus disclosed herein may also be implemented in whole or in part as one or more sets of instructions arranged to execute on one or more fixed or programmable arrays of logic elements, such as microprocessors, embedded processors, IP cores, digital signal processors, FPGAs (field-programmable gate arrays), ASSPs (application-specific standard products), and ASICs (application-specific integrated circuits). Any of the various elements of an implementation of an apparatus as disclosed herein may also be embodied as one or more computers (e.g., machines including one or more arrays programmed to execute one or more sets or sequences of instructions, also called "processors"), and any two or more, or even all, of these elements may be implemented within the same such computer or computers.

A processor or other means for processing as disclosed herein may be fabricated as one or more electronic and/or optical devices residing, for example, on the same chip or among two or more chips in a chipset. One example of such a device is a fixed or programmable array of logic elements, such as transistors or logic gates, and any of these elements may be implemented as one or more such arrays. Such an array or arrays may be implemented within one or more chips (for example, within a chipset including two or more chips). Examples of such arrays include fixed or programmable arrays of logic elements, such as microprocessors, embedded processors, IP cores, DSPs, FPGAs, ASSPs, and ASICs. A processor or other means for processing as disclosed herein may also be embodied as one or more computers (e.g., machines including one or more arrays programmed to execute one or more sets or sequences of instructions) or other processors. It is possible for a processor as described herein to be used to perform tasks or execute other sets of instructions that are not directly related to a coherency detection procedure, such as a task relating to another operation of a device or system in which the processor is embedded (e.g., an audio sensing device). It is also possible for part of a method as disclosed herein to be performed by a processor of the audio sensing device and for another part of the method to be performed under the control of one or more other processors.

Those of skill will appreciate that the various illustrative modules, logical blocks, circuits, and tests and other operations described in connection with the configurations disclosed herein may be implemented as electronic hardware, computer software, or combinations of both. Such modules, logical blocks, circuits, and operations may be implemented or performed with a general purpose processor, a digital signal processor (DSP), an ASIC or ASSP, an FPGA or other programmable logic device, discrete gate or transistor logic, discrete hardware components, or any combination thereof designed to produce the configuration as disclosed herein. For example, such a configuration may be implemented at least in part as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a general purpose processor or other digital signal processing unit. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. A software module may reside in RAM (random-access memory), ROM (read-only memory), nonvolatile RAM (NVRAM) such as flash RAM, erasable programmable ROM (EPROM), electrically erasable programmable ROM (EEPROM), registers, hard disk, a removable disk, a CD-ROM, or any other form of storage medium known in the art. An illustrative storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

It is noted that the various methods disclosed herein may be performed by an array of logic elements such as a processor, and that the various elements of an apparatus as described herein may be implemented as modules designed to execute on such an array. As used herein, the term "module" or "sub-module" can refer to any method, apparatus, device, unit or computer-readable data storage medium that includes computer instructions (e.g., logical expressions) in software, hardware or firmware form. It is to be understood that multiple modules or systems can be combined into one module or system and one module or system can be separated into multiple modules or systems to perform the same functions. When implemented in software or other computer-executable instructions, the elements of a process are essentially the code segments to perform the related tasks, such as with routines, programs, objects, components, data structures, and the like.

The term "software" should be understood to include source code, assembly language code, machine code, binary code, firmware, macrocode, microcode, any one or more sets or sequences of instructions executable by an array of logic elements, and any combination of such examples. The program or code segments can be stored in a processor readable medium or transmitted by a computer data signal embodied in a carrier wave over a transmission medium or communication link.

The implementations of methods, schemes, and techniques disclosed herein may also be tangibly embodied (for example, in one or more computer-readable media as listed herein) as one or more sets of instructions readable and/or executable by a machine including an array of logic elements (e.g., a processor, microprocessor, microcontroller, or other finite state machine). The term "computer-readable medium" may include any medium that can store or transfer information, including volatile, nonvolatile, removable and non-removable media. Examples of a computer-readable medium include an electronic circuit, a semiconductor memory device, a ROM, a flash memory, an erasable ROM (EROM), a floppy diskette or other magnetic storage, a CD-ROM/DVD or other optical storage, a hard disk, a fiber optic medium, a radio frequency (RF) link, or any other medium which can be used to store the desired information and which can be accessed. The computer data signal may include any signal that can propagate over a transmission medium such as electronic network channels, optical fibers, air, electromagnetic, RF links, etc. The code segments may be downloaded via computer networks such as the Internet or an intranet. In any case, the scope of the present disclosure should not be construed as limited by such embodiments.

Each of the tasks of the methods described herein may be embodied directly in hardware, in a software module executed by a processor, or in a combination of the two. In a typical application of an implementation of a method as disclosed herein, an array of logic elements (e.g., logic gates) is configured to perform one, more than one, or even all of the various tasks of the method. One or more (possibly all) of the tasks may also be implemented as code (e.g., one or more sets of instructions), embodied in a computer program product (e.g., one or more data storage media such as disks, flash or other nonvolatile memory cards, semiconductor memory chips, etc.), that is readable and/or executable by a machine (e.g., a computer) including an array of logic elements (e.g., a processor, microprocessor, microcontroller, or other finite state machine). The tasks of an implementation of a method as disclosed herein may also be performed by more than one such array or machine. In these or other implementations, the tasks may be performed within a device for wireless communications such as a cellular telephone or other device having such communications capability. Such a device may be configured to communicate with circuit-switched and/or packet-switched networks (e.g., using one or more protocols such as VoIP). For example, such a device may include RF circuitry configured to receive and/or transmit encoded frames.

It is expressly disclosed that the various methods disclosed herein may be performed by a portable communications device such as a handset, headset, or portable digital assistant (PDA), and that the various apparatus described herein may be included within such a device. A typical real-time (e.g., online) application is a telephone conversation conducted using such a mobile device.

In one or more exemplary embodiments, the operations described herein may be implemented in hardware, software, firmware, or any combination thereof. If implemented in software, such operations may be stored on or transmitted over a computer-readable medium as one or more instructions or code. The term "computer-readable media" includes both computer storage media and communication media, including any medium that facilitates transfer of a computer program from one place to another. A storage media may be any available media that can be accessed by a computer. By way of example, and not limitation, such computer-readable media can comprise an array of storage elements, such as semiconductor memory (which may include without limitation dynamic or static RAM, ROM, EEPROM, and/or flash RAM), or ferroelectric, magnetoresistive, ovonic, polymeric, or phase-change memory; CD-ROM or other optical disk storage, magnetic disk storage or other magnetic storage devices, or any other medium that can be used to store desired program code, in the form of instructions or data structures, in tangible structures that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technology such as infrared, radio, and/or microwave, then the coaxial cable, fiber optic cable, twisted pair, DSL, or wireless technology such as infrared, radio, and/or microwave are included in the definition of medium. Disk and disc, as used herein, includes compact disc (CD), laser disc, optical disc, digital versatile disc (DVD), floppy disk and Blu-ray Disc™ (Blu-Ray Disc Association, Universal City, Calif.), where disks usually reproduce data magnetically, while discs reproduce data optically with lasers. Combinations of the above should also be included within the scope of computer-readable media.

An acoustic signal processing apparatus as described herein may be incorporated into an electronic device that accepts speech input in order to control certain operations, or may otherwise benefit from separation of desired noises from background noises, such as communications devices. Many applications may benefit from enhancing or separating clear desired sound from background sounds originating from multiple directions. Such applications may include human-machine interfaces in electronic or computing devices which incorporate capabilities such as voice recognition and detection, speech enhancement and separation, voice-activated control, and the like. It may be desirable to implement such an acoustic signal processing apparatus to be suitable in devices that only provide limited processing capabilities.

The elements of the various implementations of the modules, elements, and devices described herein may be fabricated as electronic and/or optical devices residing, for example, on the same chip or among two or more chips in a chipset. One example of such a device is a fixed or programmable array of logic elements, such as transistors or gates. One or more elements of the various implementations of the apparatus described herein may also be implemented in whole or in part as one or more sets of instructions arranged to execute on one or more fixed or programmable arrays of logic elements such as microprocessors, embedded processors, IP cores, digital signal processors, FPGAs, ASSPs, and ASICs.

It is possible for one or more elements of an implementation of an apparatus as described herein to be used to perform tasks or execute other sets of instructions that are not directly related to an operation of the apparatus, such as a task relating to another operation of a device or system in which the apparatus is embedded. It is also possible for one or more elements of an implementation of such an apparatus to have structure in common (e.g., a processor used to execute portions of code corresponding to different elements at different times, a set of instructions executed to perform tasks corresponding to different elements at different times, or an arrangement of electronic and/or optical devices performing operations for different elements at different times).

What is claimed is:

1. A method of processing a reproduced audio signal, said method comprising performing the following acts within a device that is configured to process audio signals:

based on information from a first channel of a sensed multichannel audio signal and information from a second channel of the sensed multichannel audio signal, generating a noise estimate;

based on information from the noise estimate and a power ratio of a subband power estimate of the noise estimate to a corresponding subband power estimate of the reproduced audio signal, boosting at least one frequency subband of the reproduced audio signal with respect to at least one other frequency subband of the reproduced audio signal to produce an equalized audio signal;

based on information from a sensed noise reference signal, generating an anti-noise signal; and combining the equalized audio signal and the anti-noise signal to produce an audio output signal.

2. The method according to claim 1, wherein said method comprises:

detecting speech activity in the sensed multichannel audio signal; and in response to said detecting, varying a level of the anti-noise signal in the audio output signal.

3. The method according to claim 1, wherein said method comprises varying a level of the anti-noise signal in the audio output signal, based on at least one among a level of the noise estimate, a level of the reproduced audio signal, a level of the equalized audio signal, and a frequency distribution of the sensed multichannel audio signal.

4. The method according to claim 1, wherein said method comprises producing an acoustic signal that is based on the audio output signal and is directed toward a user's ear, and wherein the sensed noise reference signal is based on a signal produced by a microphone that is directed toward the user's ear.

5. The method according to claim 4, wherein each channel of the sensed multichannel audio signal is based on a signal produced by a corresponding one of a plurality of microphones that are directed away from the user's ear.

6. The method according to claim 1, wherein said generating an anti-noise signal comprises performing a filtering operation on the sensed noise reference signal to produce the anti-noise signal, and wherein said method comprises, based on information from the sensed multichannel audio signal, varying at least one among a gain and a cutoff frequency of the filtering operation.

7. The method according to claim 1, wherein the reproduced audio signal is based on an encoded audio signal received via a wireless transmission channel.

8. The method according to claim 1, wherein said generating a noise estimate comprises performing a directionally selective processing operation on the sensed multichannel audio signal.

9. The method according to claim 1, wherein said boosting at least one frequency subband of the reproduced audio signal with respect to at least one other frequency subband of the reproduced audio signal comprises:

based on the information from the noise estimate, calculating a value for a gain factor; and filtering the reproduced audio signal using a cascade of filter stages, wherein said filtering the reproduced audio signal comprises using the calculated value for the gain factor to vary a gain response of a filter stage of the cascade relative to a gain response of a different filter stage of the cascade.

10. A computer-readable medium having tangible structures that store machine-executable instructions which when executed by at least one processor cause the at least one processor to:

generate a noise estimate based on information from a first channel of a sensed multichannel audio signal and information from a second channel of the sensed multichannel audio signal;

boost at least one frequency subband of a reproduced audio signal with respect to at least one other frequency subband of the reproduced audio signal, based on information from the noise estimate and a power ratio of a subband power estimate of the noise estimate to a corresponding subband power estimate of the reproduced audio signal, to produce an equalized audio signal;

generate an anti-noise signal based on information from a sensed noise reference signal; and combine the equalized audio signal and the anti-noise signal to produce an audio output signal.

11. An apparatus configured to process a reproduced audio signal, said apparatus comprising:

means for generating a noise estimate based on information from a first channel of a sensed multichannel audio signal and information from a second channel of the sensed multichannel audio signal;

means for boosting at least one frequency subband of the reproduced audio signal with respect to at least one other frequency subband of the reproduced audio signal, based on information from the noise estimate and a power ratio of a subband power estimate of the noise estimate to a corresponding subband power estimate of the reproduced audio signal, to produce an equalized audio signal;

means for generating an anti-noise signal based on information from a sensed noise reference signal; and means for combining the equalized audio signal and the anti-noise signal to produce an audio output signal.

12. The apparatus according to claim 11, wherein said apparatus includes means for generating a control signal to cause at least one among said means for generating an anti-noise signal and said means for combining to vary a level of the anti-noise signal, based on at least one among a level of the noise estimate, a level of the reproduced audio signal, a level of the equalized audio signal, and a frequency distribution of the sensed multichannel audio signal.

13. The apparatus according to claim 11, wherein said apparatus includes a loudspeaker that is directed toward a user's ear and a microphone that is directed toward the user's ear, and wherein the loudspeaker is configured to produce an acoustic signal based on the audio output signal, and wherein the sensed noise reference signal is based on a signal produced by the microphone.

14. The apparatus according to claim 13, wherein said apparatus includes an array of microphones that are directed away from the user's ear, and wherein each channel of the sensed multichannel audio signal is based on a signal produced by a corresponding one of the microphones of the array.

15. The apparatus according to claim 11, wherein said means for generating a noise estimate is configured to perform a directionally selective processing operation on the sensed multichannel audio signal.

16. An apparatus configured to process a reproduced audio signal, said apparatus comprising:

a spatially selective filter configured to generate a noise estimate based on information from a first channel of a sensed multichannel audio signal and information from a second channel of the sensed multichannel audio signal;

an equalizer configured to boost at least one frequency subband of the reproduced audio signal with respect to at least one other frequency subband of the reproduced audio signal, based on information from the noise estimate and a power ratio of a subband power estimate of the noise estimate to a corresponding subband power estimate of the reproduced audio signal, to produce an equalized audio signal;

an active noise cancellation filter configured to generate an anti-noise signal based on information from a sensed noise reference signal; and an audio output stage configured to combine the equalized audio signal and the anti-noise signal to produce an audio output signal.

17. The apparatus according to claim 16, wherein said apparatus includes a control signal generator configured to control at least one among said active noise cancellation filter and said audio output stage to vary a level of the anti-noise signal, based on at least one among a level of the noise estimate, a level of the reproduced audio signal, a level of the equalized audio signal, and a frequency distribution of the sensed multichannel audio signal.

18. The apparatus according to claim 16, wherein said apparatus includes a loudspeaker that is directed toward a user's ear and a microphone that is directed toward the user's ear, and wherein the loudspeaker is configured to produce an acoustic signal based on the audio output signal, and wherein the sensed noise reference signal is based on a signal produced by the microphone.

19. The apparatus according to claim 18, wherein said apparatus includes an array of microphones that are directed away from the user's ear, and wherein each channel of the sensed multichannel audio signal is based on a signal produced by a corresponding one of the microphones of the array.

20. The apparatus according to claim 16, wherein said spatially selective filter is configured to perform a directionally selective processing operation on the sensed multichannel audio signal.

* * * * *